(12) United States Patent
Orthner et al.

(10) Patent No.: US 10,608,640 B1
(45) Date of Patent: Mar. 31, 2020

(54) ON-CHIP NETWORK IN PROGRAMMABLE INTEGRATED CIRCUIT

(71) Applicant: Achronix Semiconductor Corporation, Santa Clara, CA (US)

(72) Inventors: Kent Orthner, Santa Clara, CA (US); Travis Johnson, Santa Clara, CA (US); Sarma Jonnavithula, Bangalore (IN)

(73) Assignee: Achronix Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 16/409,146

(22) Filed: May 10, 2019

(51) Int. Cl.
| | |
|---|---|
| *H03K 19/177* | (2006.01) |
| *G06F 13/20* | (2006.01) |
| *H03K 19/17736* | (2020.01) |
| *H03K 19/1776* | (2020.01) |
| *G06F 13/42* | (2006.01) |
| *H03K 19/17796* | (2020.01) |
| *H03K 19/17728* | (2020.01) |

(52) U.S. Cl.
CPC ....... *H03K 19/17744* (2013.01); *G06F 13/20* (2013.01); *G06F 13/4282* (2013.01); *H03K 19/1776* (2013.01); *H03K 19/17728* (2013.01); *H03K 19/17736* (2013.01); *H03K 19/17796* (2013.01); *G06F 2213/0026* (2013.01)

(58) Field of Classification Search
CPC ......... H03K 19/17744; H03K 19/1776; H03K 19/17736; H03K 19/17748; H03K 19/17728; H03K 19/017581; H03K 19/17776; H03K 19/17796; G06F 13/20; G06F 13/4282; G06F 2213/0026
See application file for complete search history.

(56) References Cited

U.S. PATENT DOCUMENTS

| | | | | |
|---|---|---|---|---|
| 9,405,713 | B2* | 8/2016 | Stark | G06F 13/385 |
| 10,116,557 | B2* | 10/2018 | Gray | H04L 45/60 |
| 10,187,064 | B1* | 1/2019 | Atsatt | H03K 19/17796 |
| 10,318,723 | B1* | 6/2019 | Paczkowski | G06F 21/44 |
| 10,346,346 | B1* | 7/2019 | Arbel | G06F 11/10 |

* cited by examiner

*Primary Examiner* — Vibol Tan
(74) *Attorney, Agent, or Firm* — Schwegman Lundberg & Woessner, P.A.

(57) ABSTRACT

Methods, systems, and computer programs are presented for implementing a network on chip (NOC). One programmable integrated circuit comprises a plurality of clusters, an internal network on chip (iNOC), and an external network on chip (eNOC) outside the plurality of clusters. The plurality of clusters is disposed on a plurality of cluster rows and a plurality of cluster columns, each cluster comprising programmable logic. Further, the iNOC comprises iNOC rows and iNOC columns. Each iNOC row is configured for transporting data and comprising connections to clusters in a cluster row and the eNOC, and each iNOC column is configured for transporting data and comprising connections to clusters in a cluster column and the eNOC.

20 Claims, 21 Drawing Sheets

1400

RECEIVE, AT A PROGRAMMABLE INTEGRATED CIRCUIT (IC), A CONFIGURATION FOR THE PROGRAMMABLE IC, THE PROGRAMMABLE IC COMPRISING:
   A PLURALITY OF CLUSTERS DISPOSED ON A PLURALITY OF CLUSTER ROWS AND A PLURALITY OF CLUSTER COLUMNS, EACH CLUSTER COMPRISING PROGRAMMABLE LOGIC;
   AN INTERNAL NETWORK ON CHIP (INOC) COMPRISING INOC ROWS AND INOC COLUMNS; AND
   AN EXTERNAL NETWORK ON CHIP (ENOC) OUTSIDE THE PLURALITY OF CLUSTERS, EACH INOC ROW CONFIGURED FOR TRANSPORTING DATA AND COMPRISING CONNECTIONS TO CLUSTERS IN A CLUSTER ROW AND THE ENOC, EACH INOC COLUMN CONFIGURED FOR TRANSPORTING DATA AND COMPRISING CONNECTIONS TO CLUSTERS IN A CLUSTER COLUMN AND THE ENOC — 1402

CONFIGURE THE PROGRAMMABLE IC BASED ON THE CONFIGURATION — 1404

PROVIDE COMMUNICATIONS, UTILIZING A COMBINATION OF INOC AND ENOC COMMUNICATIONS, TO ENABLE ANY CLUSTER TO COMMUNICATE TO ANY OTHER CLUSTER AND TO COMMUNICATION MODULES WITH EXTERNAL INTERFACES COUPLED TO THE ENOC — 1406

FIG. 14

ON-CHIP NETWORK IN PROGRAMMABLE INTEGRATED CIRCUIT

TECHNICAL FIELD

The subject matter disclosed herein generally relates to methods, systems, and machine-readable storage media for providing on-chip networking inside a Field Programmable Gate Array (FPGA).

BACKGROUND

FPGAs are increasingly being used for applications that require high-speed data communications, such as machine learning, networking acceleration, and storage acceleration. FPGAs may include high frequency and high throughput interfaces, but the internal capabilities of the FPGA are lacking for handling high throughputs due to the lower operating frequencies of the user logic at the FPGA core.

For example, a peripheral component interconnect express (PCIe) may operate at 500 gigabits per second and a graphics double data rate type six synchronous dynamic random-access (GDDR6) memory may have interfaces supporting 4 terabits per second. On the other hand, the FPGA may operate at 700 Megahertz, making it difficult to provide functionality for PCIe and GDDR6 memories at the FPGA.

BRIEF DESCRIPTION OF THE DRAWINGS

Various ones of the appended drawings merely illustrate example embodiments of the present disclosure and cannot be considered as limiting its scope.

FIG. 14 is a flowchart of a method implementing a network on chip (NOC), according to some example embodiments.

DETAILED DESCRIPTION

Figure 1:
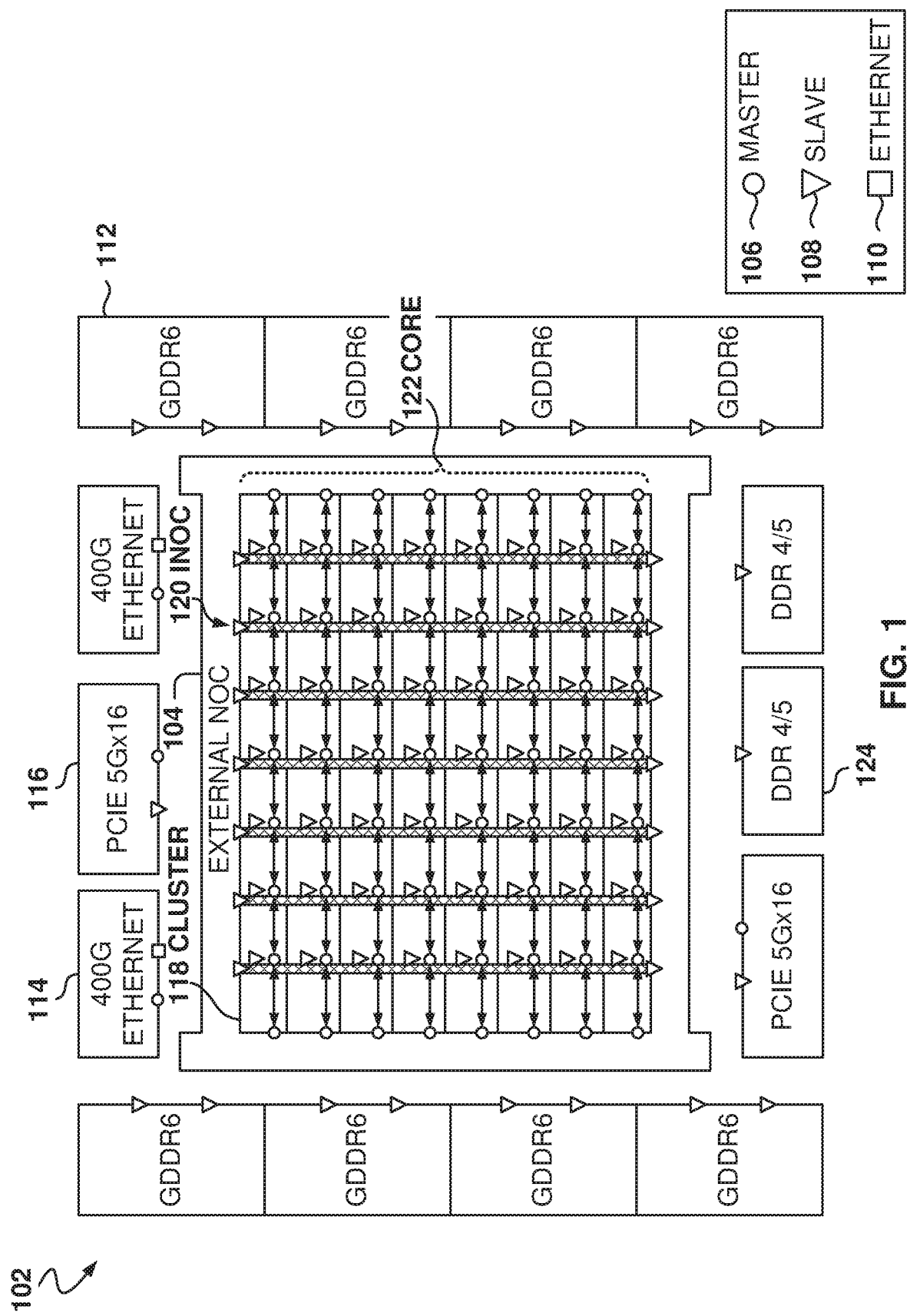
FIG. 1 illustrates the architecture of an FPGA with on-chip networking capabilities, according to some example embodiments.

Example methods, systems, and computer programs are directed to providing on-chip networking for programmable integrated circuits, such as FPGAs. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

In traditional FPGAs, the intellectual property (IP) cores that support high-speed interfaces and memory are located at the boundary of the FPGA core, and the FPGA development engineer must develop logic that provides a path from the acceleration core, within the FPGA logic, to the FPGA boundary adjacent the interface IP core. If the acceleration is distributed in different locations within the FPGA core, the FPGA designer must implement logic that distributes or collects data from different portions of the chip, including the destination decoding and arbitration that might be required. In typical designs, this portion of the FPGA design consumes a significant portion of the FPGA logic. With modern data acceleration requirements, the routing and logic congestion of the data paths to and from the IP cores make it impossible to implement a satisfactory design in some demanding scenarios.

The network-in-FPGA implementation, also referred to as network on chip (NOC), described here provides low-latency and high-throughput access to the high-speed IP interfaces on the device. The NOC provides access to FPGA design logic (e.g., user logic) located anywhere in the FPGA core, and optimized support for features such as address decoding, data routing, arbitration, and flow control, without consuming FPGA logic resources. Since FPGA resources are not consumed to support data communications, the communication between user logic and high-speed modules does not cause congestion in the FPGA core. Additionally, the dedicated on-chip network provides outside access with lower latency than what may typically be implemented using the FPGA core logic.

In some implementations, the iNOC includes a two-dimensional mesh network where any node in the mesh network provides the FPGA logic the ability to issue read and write commands to anywhere in the device, regardless of the geographic location of the node itself. For example, the FPGA may issue network transactions to ASIC-implemented slaves such as memory interface IP (DDR, GDDR, HBM, etc.), Ethernet interfaces, PCI Express, etc. Additionally, masters on the device such as PCI Express, the FPGA Control Unit (FCU) configuration master, and Joint Test Action Group (JTAG) debug master, may issue network transactions to any location in the FPGA. Further, any location in the FPGA may issue network transactions to any other location in the FPGA without using FPGA IP resources.

The NOC supports multiple concurrent network protocols, such as Advanced eXtensible Interface (AXI), Ethernet, Cache Coherent Interconnect for Acceleration (CCIX), Advanced Peripheral Bus (APB), Advanced Microcontroller Bus Architecture (AMBA) High-performance Bus (AHB), Open Core Protocol (OCP), Wishbone, CCIX Stream Interface (CXS) protocols, and other arbitrary packetized, or un-packetized, data streams.

In some implementations, the iNOC includes using vertical connectivity for master-to-FPGA transactions and horizontal connectivity for FPGA-to-slave transactions, but other configurations are possible.

The network links on the NOC are optimized to allow for master and slave request traffic, as well as response traffic, to share the same physical links. For example, per-column and per-row write transaction reassembly buffers are provided to enable interleaving and latency minimization.

In some implementations, the FPGA core drives the FPGA configuration logic and is able to access the control and status (CSR) interfaces of any IP on the device.

Further, broadcast and multicast capabilities are provided within the NOC and the use of specialized traffic classes avoid possible deadlocks. For example, transactions responses are guaranteed to make forward progress in the presence of command-request congestion at one node.

Further, the NOC provides a configurable arbitration fairness algorithm for traffic within a node. Also, a mechanism to guarantee transaction ordering for flow control units (flits) travelling in different directions is provided.

One general aspect includes a programmable integrated circuit that comprises a plurality of clusters, an internal network on chip (iNOC), and an external network on chip (eNOC) outside the plurality of clusters. The plurality of clusters is disposed on a plurality of cluster rows and a plurality of cluster columns, each cluster comprising programmable logic. Further, the iNOC comprises iNOC rows and iNOC columns. Each iNOC row is configured for transporting data and comprising connections to clusters in a cluster row and the eNOC, and each iNOC column is configured for transporting data and comprising connections to clusters in a cluster column and the eNOC.

One general aspect includes a programmable integrated circuit comprising a plurality of clusters, an iNOC comprising iNOC rows and iNOC columns, an eNOC connected to the iNOC rows and the iNOC columns, and an FCU. The plurality of clusters is disposed on a plurality of cluster rows and a plurality of cluster columns, each cluster comprising programmable logic. The FCU is for configuring the programmable logic in the plurality of clusters based on a first configuration received by the FCU, the FCU being connected to the eNOC. The FCU communicates with the plurality of clusters via the iNOC and the eNOC, where the FCU is configured for receiving a second configuration from the programmable logic in the plurality of clusters for reconfiguring a component of the programmable integrated circuit.

FIG. 1 illustrates the architecture of an FPGA 102 with on-chip networking capabilities, according to some example embodiments. The FPGA 102 includes an external NOC (eNOC) 104 and an internal NOC (iNOC) 120, which provide high-throughput and easy-to-use access between peripherals and the FPGA core 122. The combination of iNOC 120 and eNOC 104 are referred to herein as the NOC. The FPGA core 122 is surrounded by the eNOC 104 and includes the clusters 118, which are units of programmable logic configurable by the user.

In a typical FPGA, it may be difficult to move data quickly because the FPGA logic runs slower than a typical dedicated processor. The NOC implements a hierarchy of networks that allows high throughput and fast data movement inside the FPGA.

There is a plurality of external interfaces that exchange data with the outside of the FPGA, such as Ethernet controller 114, PCIe controller 116, and GDDR6 controller 112. In a traditional FPGA, the external interfaces are connected directly to the clusters 118 and the ability to transfer data is then limited by the speed of the clusters 118. Further, data exchange may require configuring a large number of clusters 118. For example, if the PCIe controller 116 wants to talk to DDR-4 controller 124, the user has to design the FPGA to carry read and write requests all the way across the fabric, in both directions, and this would require the use of a large amount of user logic that may not be used for other purposes. Further, the transfer would be slow when compared to the speeds supported by the external interfaces.

In some example embodiments, the eNOC 104 and the iNOC 120 support read/write transactions between masters and slaves. Master/slave is a model of communication where one device or process has control over one or more other devices. In the FPGA, the master is able to initiate transactions, i.e., send requests, while the slave waits for any master to send a request. The eNOC 104 also supports cut-through and store-and-forward communications.

The masters include, at least, PCIe controller 116, user-implemented masters in the FPGA core 122, and a FPGA control unit (FCU) (allowing bitstream commands to read and write peripheral control and status (CSR) interfaces). The slaves include, at least, GDDR6 controllers 112, DDR4/5 controllers 124, user-implemented slaves in the FPGA core 122, PCIe controller 116, the FCU (allowing masters in the subsystem, such as PCIe, to configure the FPGA as discussed below with reference to FIG. 9A), and CSR interfaces of clusters 118 (e.g., including phase lock loops (PLLs), Input/Outputs, top-level clock/reset).

In some example embodiments, the iNOC 120 is implemented with regularly spaced elements in the FPGA core 122, and the iNOC 120 includes a plurality of columns and a plurality of rows. The example illustrated in FIG. 1 includes seven columns and eight rows, but other embodiments may use a different number of columns and rows (e.g., in the range from 1 to 50 or more, although other values are also possible).

In some example embodiments, each row includes a fast data path (e.g., 512 Gbps, but other speeds are also possible) in the eastbound and westbound directions, and each column includes a fast data path in the northbound and the southbound directions.

The iNOC 120 and eNOC 104 transport packets and provide a packet-transfer interface to the modules using the NOC. In some example embodiments, the packet interface supports Advanced Extensible Interface (AXI) read and write transactions. AXI is part of the Advanced Microcontroller Bus Architecture (AMBA), which is an open-standard, on-chip interconnect specification for the connection and management of functional blocks in system-on-a-chip (SoC) designs.

The user logic in the cluster 118 can issue AXI read or write transactions to a local network access point (NAP) in the cluster 118. Based on the routing logic, the iNOC 120 carries the transaction to the eNOC 104 at the east or west boundary of the FPGA core 122. In some example embodiments, the iNOC 120 transports transactions issued by user FPGA logic to the east or west, and transactions destined to the FPGA user logic arrive from the north or south, but other traffic patterns may also be supported.

In one embodiment with 512 Gbps transport on the iNOC 120, assuming 4-cycle bursts, each iNOC row is able to support 409 Gbps of write data throughput, since the write command is sent as the first cycle of each transaction. Larger-size bursts will result in higher throughput, and smaller-size bursts will result in lower throughput. The transactions on each row or column share the available bandwidth with other transactions on the same row or column.

Each column of the iNOC 120 operates similar to the rows, except packet data is carried in the northbound or southbound directions. In some example embodiments, the horizontal component of the iNOC 120 allows the user logic in cluster 118 to issue read/write transactions (e.g., AXI transactions), and the vertical component of the iNOC 120 allows IP components outside of the FPGA core 122 to issue transactions to the clusters 118. In other words, the FPGA masters 106 connect to the rows of the iNOC 120, and the FPGA slaves 108 connect to the columns of the iNOC 120.

The iNOC 120 supports multiple traffic types, including transaction data and packet data streams. The transaction data includes read and write commands, data, and responses. The command transfers are typically a single cycle, and data transfers are typically short, with 4-cycle transactions being very common.

The traffic types include Cache Coherent Interconnect for Accelerators (CCIX) data, packet data, and raw user data. In some example embodiments, the iNOC 120 carries CCIX data from the PCIe controller 116 when working in CCIX mode. This is presented to the user as a CSX-protocol formatted data stream, which is effectively a segmented interface that the user unpacks.

The packet data may be bundled as longer streams of data. In some example embodiments, the iNOC 120 imposes no upper limit on packet sizes. Further yet, with regards to raw user data transport, the iNOC 120 transports flits between NAPs within the same column or the same row, and the flits are combined to form the packets.

In some example embodiments, each row of the iNOC 120 presents a master 106 to the eNOC 104 on the west side of the FPGA core 122, and another master 106 on the east side of the FPGA core 122. Each column of the iNOC 120 presents a slave 108 to the iNOC 120 on the north side and another one on the south side. This allows user logic to read or write any external IP or CSR interface, and allows any external IP with a master interface to access any NAP with attached user logic.

In some example embodiments, the eNOC 104 is a ring around the FPGA core 122 that carries transactions from the outside of the eNOC 104 to the clusters 118, and vice-versa, as well as between clusters 118. In some example embodiments, the eNOC 104 provides address decoding, transaction command and response routing, message-width adaptation, frequency adaptation (e.g., clock domain crossing), burst adaptation, and protocol conversion.

The eNOC 104 carries read and write transactions. In some example embodiments, the eNOC 104 does not carry Ethernet packets, Serdes data, or CCIX data, and does not carry interrupt information. However, other embodiments may transport one or more of Ethernet packets, Serdes data, CCIX data, and carry interrupt information.

The combination of iNOC 120 and eNOC 104 is such that any access point in the FPGA has access to any interface IP slave interface, including any of the GDDR6 controller 112, DDR-4 controller 124, and PCIe controller 116 interfaces.

In some example embodiments, each memory interface presents a slave (e.g., with a data path width of 256b) to the NOC and accepts read and write transactions. Further, PCIe masters 106 and slaves 108 are connected directly to the eNOC 104.

A NOC node, or simply referred to herein as a node, is a component of the network that is connected, and in communication with, other nodes. Each node comprises, for each direction of traffic, a router and a NAP. The NAP has the connections to the local user logic in the cluster 118 and the router carries packets (e.g., flits) to other routers in other nodes. Thus, user logic accesses the NOC by communicating with the NAP that interfaces with the router.

The router makes routing decisions for the flits travelling on the network and the NAP "slows" the transfer of data from the high-speed NOC network to the lower speeds of the user logic in the cluster 118. The NAP also formats the data into the corresponding protocol, such as Ethernet or AXI. An EW (east-west) router is a router in the east-west direction, that is, a router in the rows of the iNOC. An NS (north-south) router is a router is in the north-south direction, i.e., a router in the columns of the iNOC.

CXS, or CXS interface, refers to the CCIX Stream Interface. A Graphics Dual Data Rate Memory (GDDR), or GDDR6, is a memory unit (JEDEC standard 6.0 is inferred unless specified otherwise). A Dual Data Rate Memory (DDR), or DDR4, is a memory unit (JEDEC standard 4.0 is inferred unless specified otherwise). A WAW flit is a special kind of flit encapsulating both write data channel and write address channel in the same flit, allowing for more efficient data transport. The Ethernet Interfacing Unit (EIU) is the interface that sends Ethernet data to iNOC 120 columns. Further, a CCIX Interfacing Unit (CXIU) is the interface that sends CXS data to iNOC columns.

Each node has two sets of router and NAP combination: an EW router and NAP, and an NS router and NAP. Further, the router at each node is independent from other routers and drives incoming flits to either the next node (next router) or towards the corresponding local NAP. Each router decides if the flit is consumed in the node or forwarded to the next node based on a destination ID field in the flit. In some example embodiments, the flit has a 12-bit transport information and a 291-bit payload, but other formats are possible. The flit payload is utilized to carry various types of data, and in the case of AXI transactions, the 291-bit payload carries AXI signals. In non-AXI flits, the flits are configured to encapsulate raw data, Ethernet packets, or CXS streams. Multiple flit formats are supported for different types of loads.

In the case of AXI transactions, the EW router is attached to the EW NAP which acts as an AXI slave to the user logic. The NS router is attached to the NS NAP which acts as an AXI master over the user logic. Hence, the EW direction generates requests and receives responses while the NS direction receives commands and generates responses.

In the case of raw data transfers, the EW NAP generates raw data flits, which are received by another EW NAP. The transfer happens through the EW iNOC. Similarly, the NS NAP generates a raw data flit and is received by another NS NAP.

In the case of CXS flits, the NS NAP receives and generates the CXS flits, where each CXS flit encapsulates a CXS stream and is carried through the NS iNOC infrastructure towards the CXIU, which interfaces with PCIe or CCIX.

In the case of Ethernet flits, the NS NAP receives and generates the Ethernet packets. Each Ethernet flit encapsulates an Ethernet packet in full or in part. The iNOC infrastructure carries the data to the EIU, which handles the interfacing with the Ethernet MAC. This way, the iNOC 120 supports both memory-mapped data-transport infrastructure as well as pure data-stream-transport infrastructure.

Thus, the NOC provides a high-speed network that runs around the outside of the user logic, using very fast links (e.g., 2 gigahertz) that are thousands of bits wide, resulting in much lower latency and much higher throughput path to that memory without the user having to design any intermediate cluster 118 for communications. Thus, the FPGA may be unprogrammed and the PCIe controller 116 is able to talk to the DDR-4 controller 124 without any configuration. This allows the better use of user logic for the user's programmable functions.

In some example embodiments, the NOC is a transaction network that supports reads and writes. A read is requested from any address and a write may be performed to any address.

To benefit from the NOC functionality, the user instantiates a NAP in their design. To access the variety of IP visible through the NOC, the user configures the NAP. Further, to use the NOC to communicate between clusters 118 on the FPGA, the user instantiates NAP blocks at each node, and uses standard interfaces, such as AXI or Packet interfaces, or even uses the user's own interfaces. In summary, the NOC carries multiple types of traffic simultaneously.

For example, the user instantiates 256-bit NAPs in their design to gain access to the iNOC 120. Assuming the user's design is able to meet a frequency of 600 MHz, a single NAP provides 153.6 Gbps of read throughput, and 153.6 Gbps of write throughput.

Figure 2:
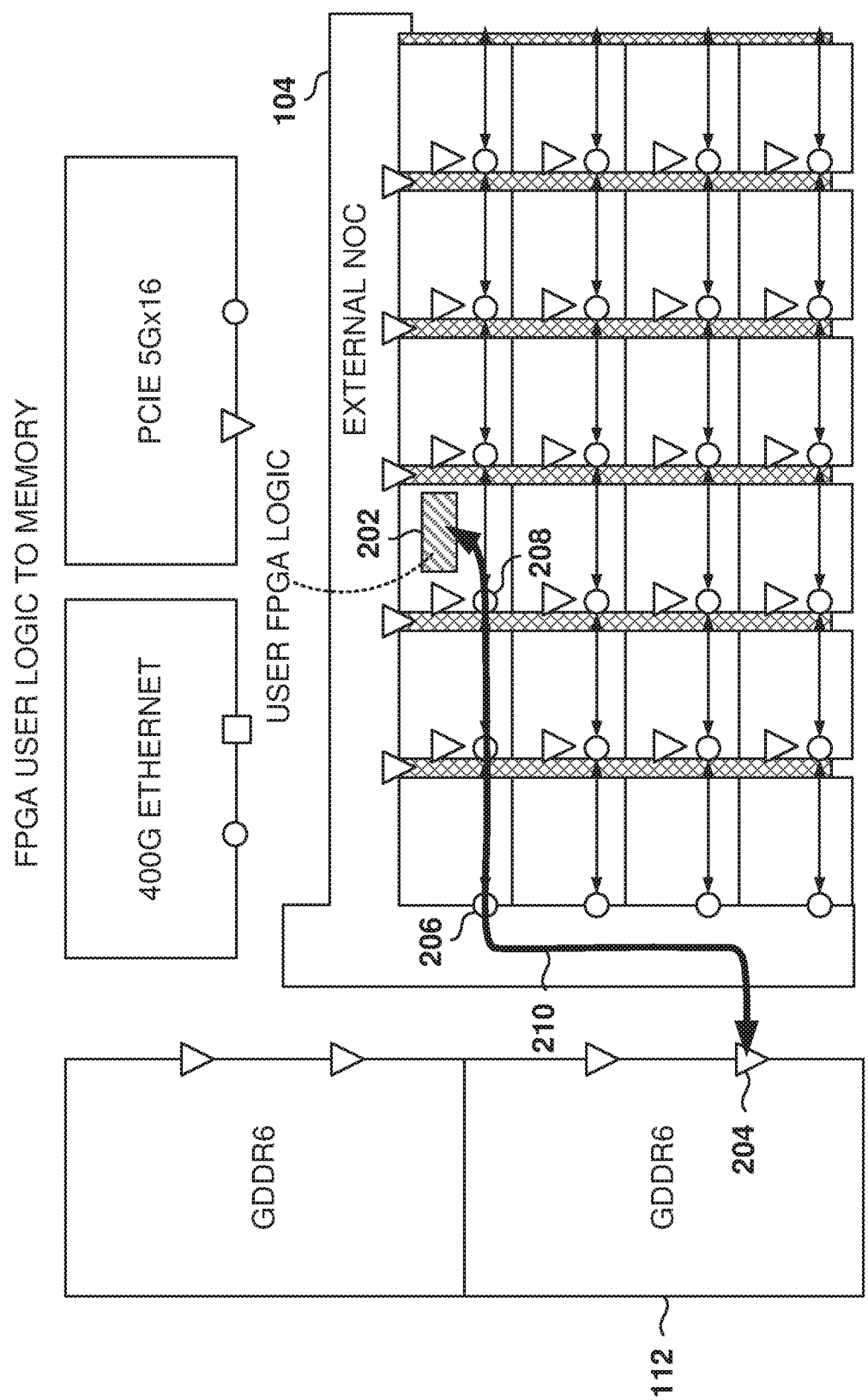
FIG. 2 illustrates the data flow between user logic and a memory module, according to some example embodiments.

FIG. 2 illustrates the data flow between user logic 202 and a memory module GDDR6 controller 112, according to some example embodiments. In the illustrated example, there are four GDDR6 controllers 112 on the east side of the device, and four GDDR6 controllers 112 on the west side of the device. In some example embodiments, each of these GDDR6 controllers 112 supports up to 576 Gbps of memory throughput, assuming that there are GDDR6 components that support 18 Gbps lanes. The GDDR6 controller 112 presents two AXI interfaces, each of which represents 288 Gbps of memory bandwidth, for a total of eight AXI interfaces on each of the east and west sides of the device. The iNOC 120 also has eight rows, so there is one iNOC row per AXI interface supporting 512 Gbps.

The iNOC rows are not dedicated to specific GDDR6 memory controllers; any iNOC row has access to any GDDR6 controller, and one iNOC row's traffic will often be spread out across multiple memory controllers. It is therefore beneficial that a single iNOC row has more bandwidth available than a single GDDR6 controller. To add to the complexity, every write transaction across the iNOC 120 requires an iNOC clock cycle to transfer the command ahead of transferring the data. This means that a 4-cycle write burst utilizes five iNOC cycles (80% efficiency), and that a single-cycle AXI write burst utilizes two iNOC cycles (50% efficiency).

In the example illustrated in FIG. 2, the user logic 202 issues a transaction to the local NAP, which transfers to the router 208, and the iNOC row carries it to the east or west edge of the FPGA core 122, where it is presented to the eNOC 104. From there, the eNOC 104 carries the transaction to the correct GDDR6 controller 112 interface. The responses follow the same path in reverse. In the example, the local iNOC 120 carries the user request from router 208 (master) to router 206. The eNOC 104 carries the request from router 206 to the GDDR6 interface 204 (slave). The response will follow the reverse path.

In some example embodiments, the AXI interface is used, where the request is a read command and the response carries the data back to the user logic 202.

Figure 3:
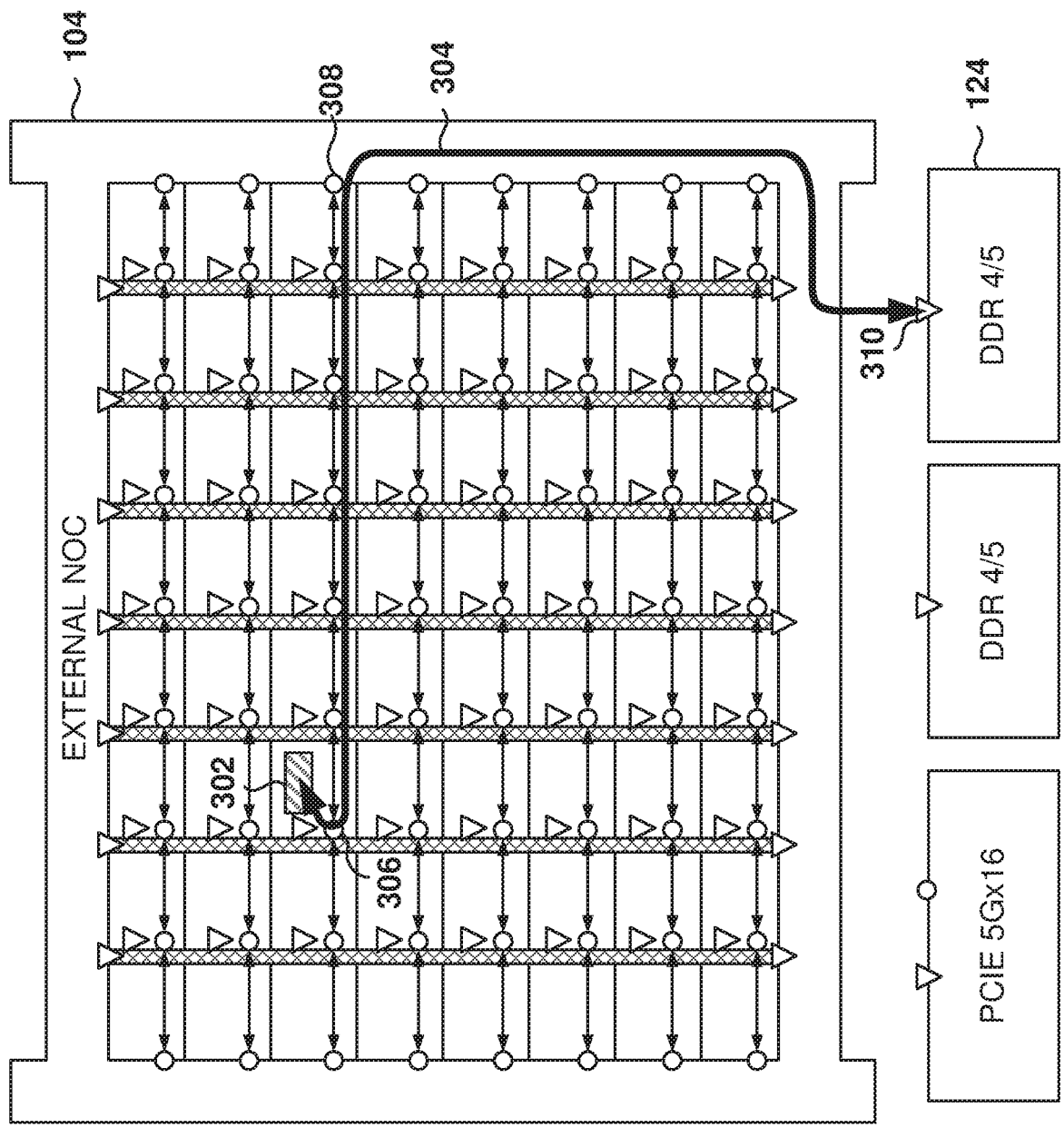
FIG. 3 illustrates the data flow between logic and a memory module utilizing the internal network on chip (iNOC) and the external network on chip (eNOC), according to some example embodiments.

FIG. 3 illustrates the data flow between user logic 302 and a memory module DDR-4 controller 124 utilizing the iNOC 120 and the eNOC 104, according to some example embodiments. The user logic 302 issues a transaction 304 to the local NAP, which transfers the transaction to router 306, which carries it to the router 308 at west edge of the FPGA core 122, where the transaction is presented to the eNOC 104. The eNOC 104 carries the request to the correct DDR 4/5 interface 310, which is the DDR-4 controller 124 in this example. The response follows the same path in the reverse direction. It is noted that some embodiments describe transactions using the node routers, which implies the use of the local NAP for accessing the user logic, and for simplicity of description it may be described that the router transfers or receives data from the user logic, which implies using the local NAP although it may be omitted from the description.

Figure 4:
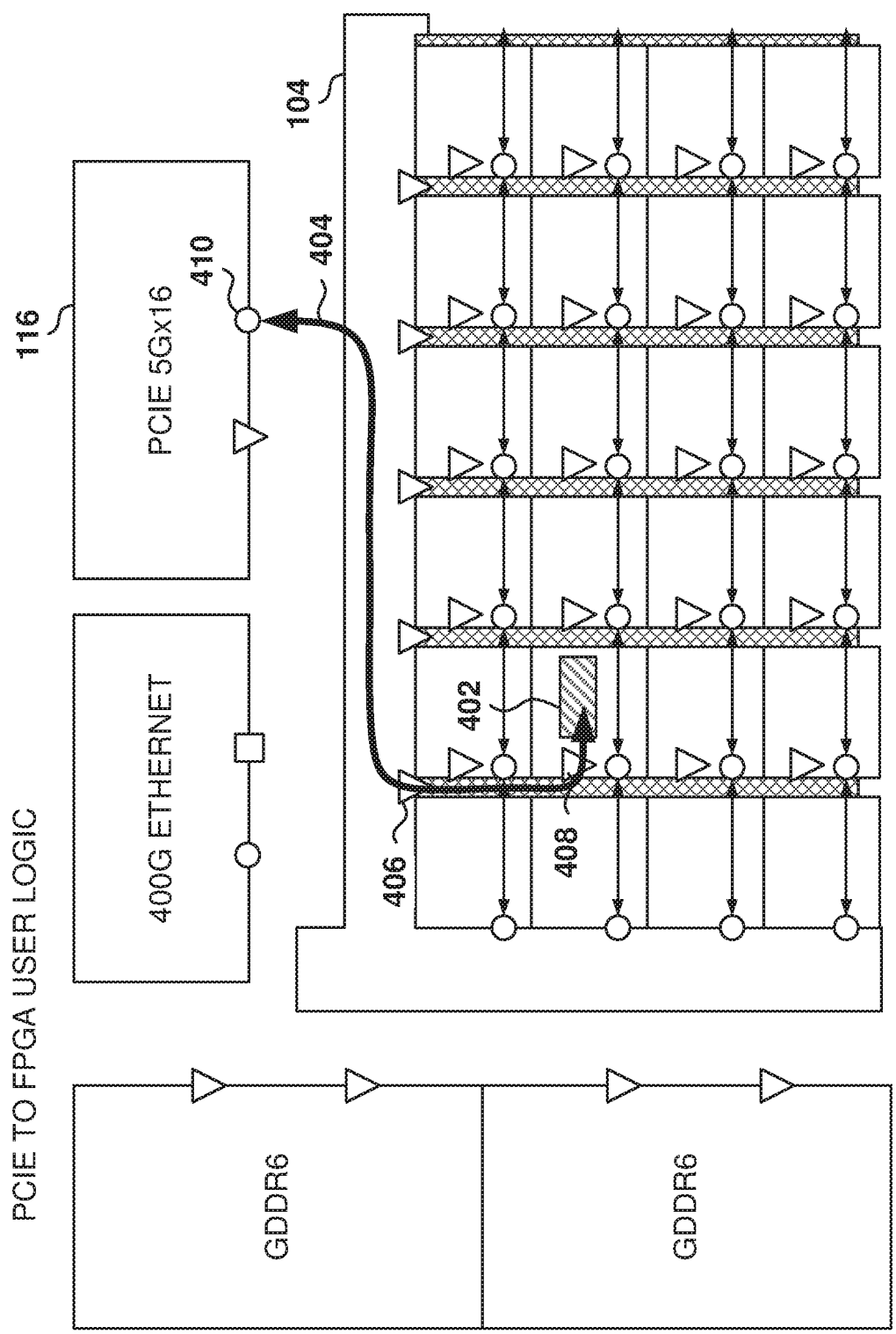
FIG. 4 illustrates the data flow between user logic and a peripheral component interconnect express (PCIe) module, according to some example embodiments.

FIG. 4 illustrates the data flow between user logic 402 and PCIe controller 116, according to some example embodiments. The iNOC's vertical connectivity allows masters 106 outside the FPGA core 122 to issue transactions to slaves 108 inside the FPGA core 122. It also allows Ethernet packets to be driven from the Ethernet controllers directly down the columns of the iNOC 120 into the FPGA core 122.

In some example embodiments, the PCIe controller 116 supports up to 512 Gbps throughput, which is the same nominal throughput as that supported by the iNOC columns. If the PCIe controller 116 master issues transactions to routers in more than one column, then there is ample throughput in the vertical iNOC.

In the illustrated example, the PCIe interface 410 (master) connects to the eNOC 104, which carries the request to slave 406 in the iNOC column. The iNOC column then carries the request to router 408, which delivers the request to user logic 402 via the corresponding NAP. The reverse communication follows the same path in the opposite direction. The iNOC column is selected based on the address provided by the master (e.g., interface 410).

Figure 5:
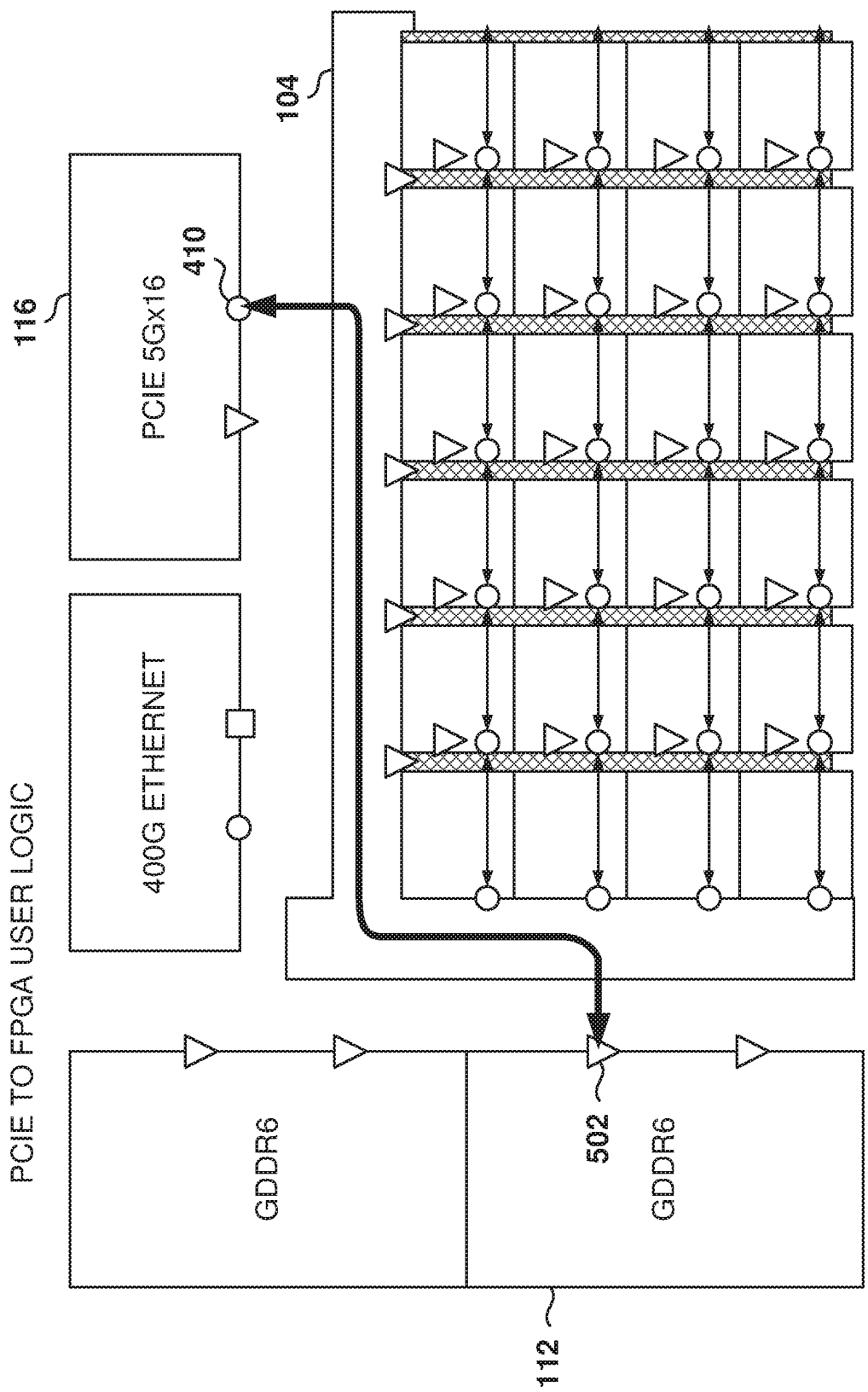
FIG. 5 illustrates the data flow between the PCIe module and a memory module, according to some example embodiments.

FIG. 5 illustrates the data flow between the PCIe controller 116 and GDDR6 controller 112, according to some example embodiments. The PCIe controller 116 issues a transaction as a master 106 on interface 410 and the eNOC 104 carries the transaction to interface 502 (slave) of GDDR6 controller 112. In this case, the FPGA core 122 is not involved in the communication between the PCIe controller 116 and the GDDR6 controller 112, and the eNOC 104 transports the command and the response.

Figure 6:
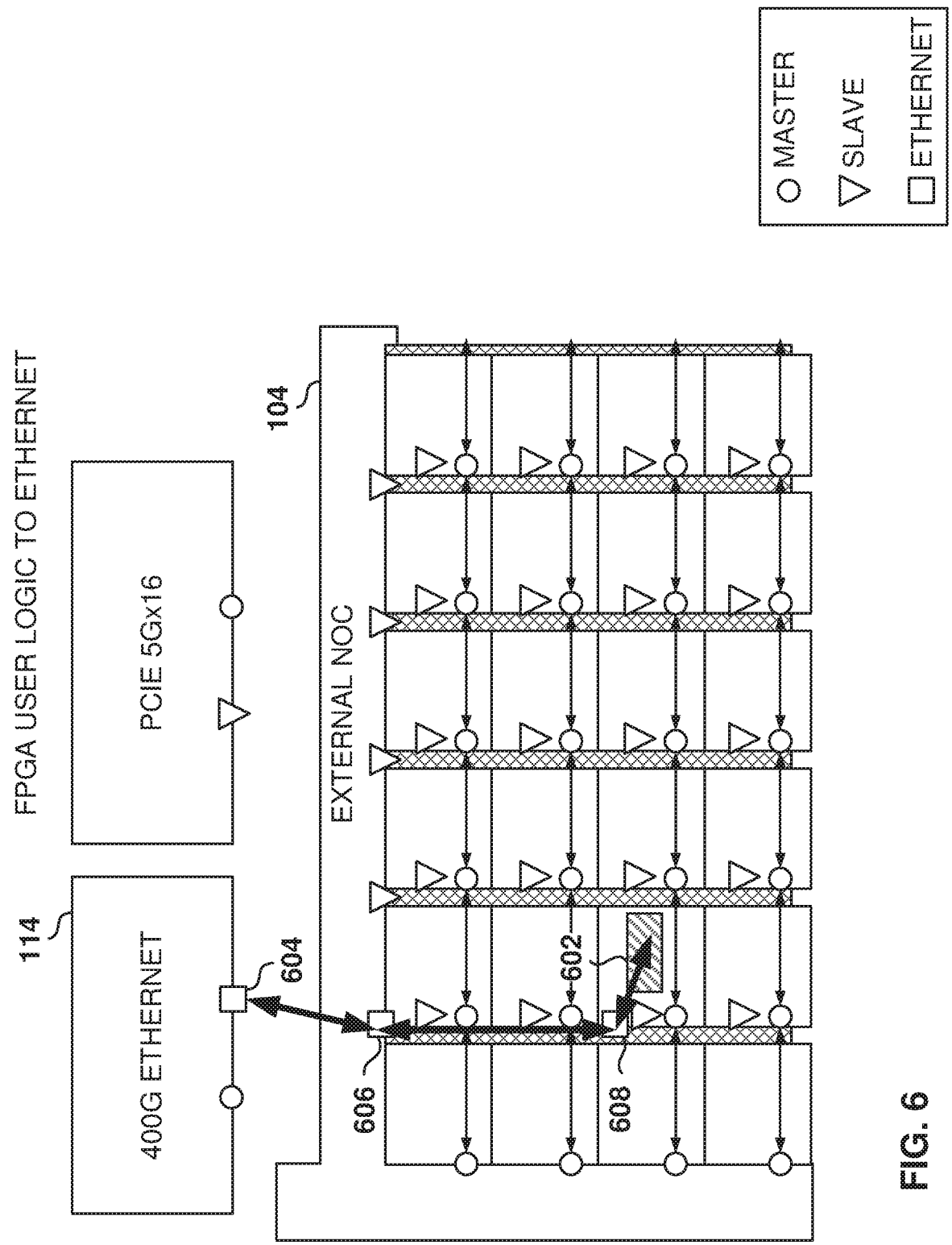
FIG. 6 illustrates an Ethernet connection to user logic, according to some example embodiments.

FIG. 6 illustrates an Ethernet connection to user logic, according to some example embodiments. In some example embodiments, the Ethernet controller 114 supports up to 400 Gbps of throughput, although other speeds may be supported.

In some example embodiments, the Ethernet controller 114 is connected directly to one or more columns of the iNOC 120, which allows the Ethernet controller 114 to issue packets directly to one of the iNOC columns without having to travel through the eNOC 104. In other example embodiments, the Ethernet packets may be transferred through the eNOC 104 and may be transferred to any column.

In the example illustrated in FIG. 6, an Ethernet packet is sent from interface 604 to the router 606 on top of the iNOC column, where the router 606 supports the transfer of Ethernet packets. The iNOC column carries the packet to the correct row, where it is delivered to the router 608 that is configured for packet transport. The router 608 then transfers the packet to the user logic 602 via the local NAP. The reverse data transfer follows the same path in the reverse direction.

In some example embodiments, for Ethernet packet transfers, 288 bits are transferred in every flit. The 288-bit data carries data to a single router 608 as specified in the flit. To interface with user logic in Ethernet mode, the router 608 reuses AXI data signals along with 32-bit additional signals. The Ethernet data is presented to the user logic on the same 288-bit interface used by CXS and raw-data transport. Further, the Ethernet packet may be encapsulated with additional information in the flit.

In some example embodiments, the NAP is able to translate the Ethernet format and protocol to AXI format and protocol. For example, the NAP may receive Ethernet packets, translate the data to AXI, and store the translated data in a memory location. Thus, the iNOC columns support the transport of two different types of protocol, such as Ethernet and AXI.

Figure 11:
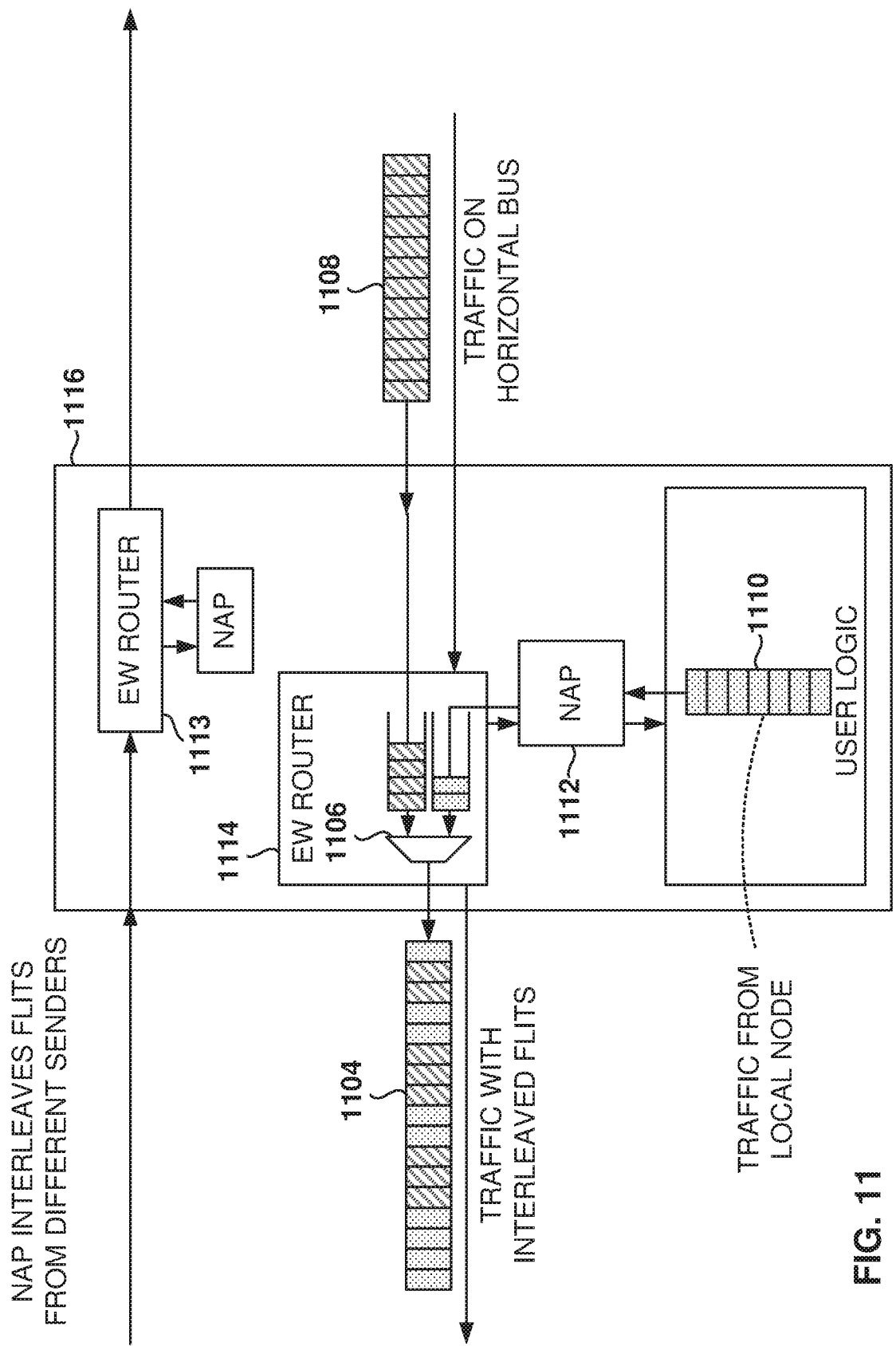
FIG. 11 illustrates the interleaving of flow control units (flits) during transport, according to some example embodiments.

Further, the two types of traffic may be interleaved, as illustrated in FIG. 11. However, the final destination of the packets within the IP core will be different for Ethernet and AXI.

Figure 7:
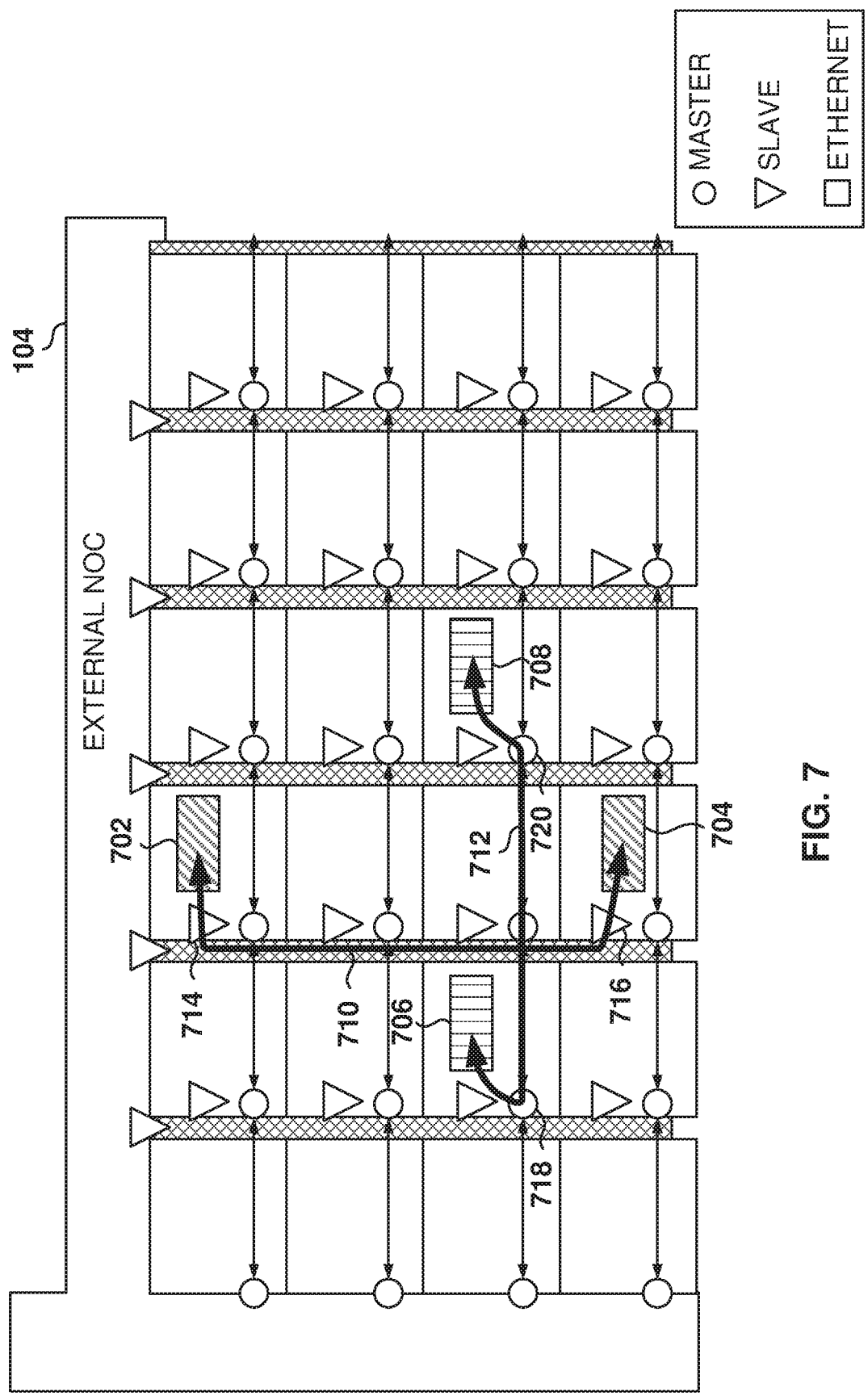
FIG. 7 illustrates data flows between user-logic modules using the iNOC, according to some example embodiments.

FIG. 7 illustrates data flows between user-logic modules using the iNOC 120, according to some example embodiments. In addition to transporting read and write transactions, each NAP is configurable to bypass the transaction-in-packet encapsulation functionality, such that the iNOC 120 transports raw packets. This is used to move data between different regions within the FPGA.

Figure 8:
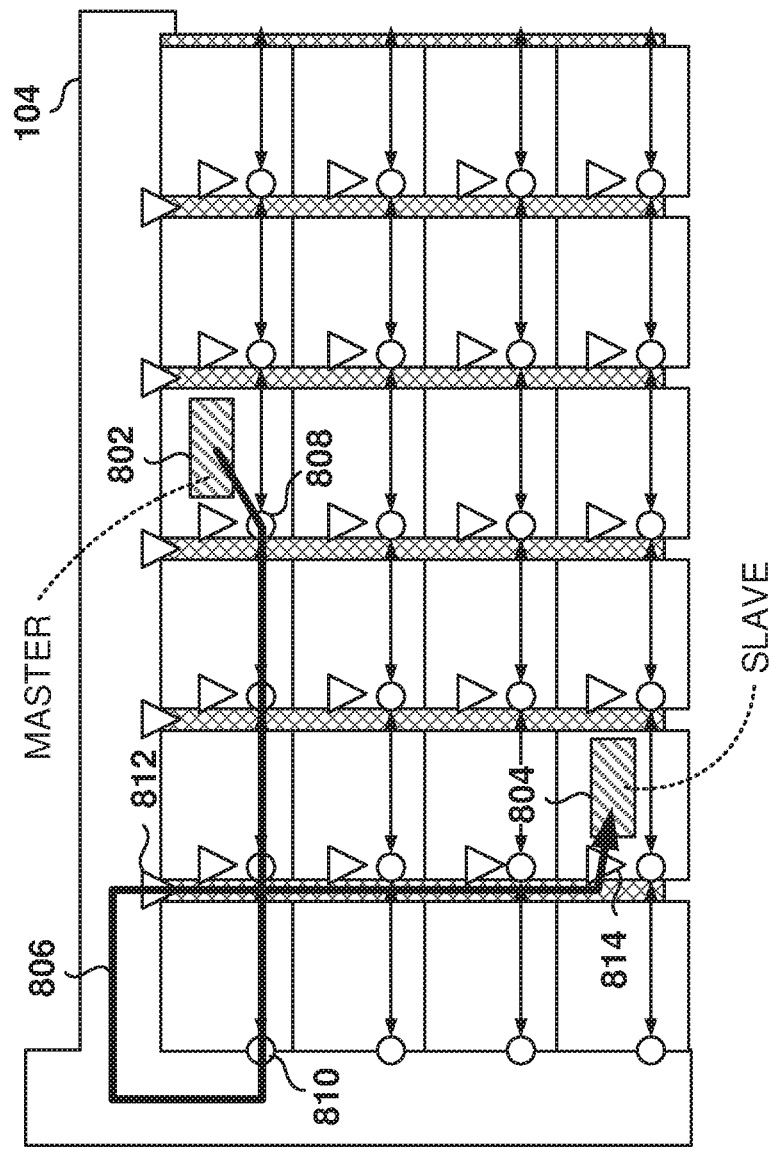
FIG. 8 illustrates the data flow between a user-logic master and a user-logic slave, according to some example embodiments.

In some example embodiments, the horizontal and vertical components of the iNOC 120 are independent, and a packet may be sent to a node on the same row or the same column. If a packet cannot be sent directly via a row or a column, the packet is sent to the eNOC 104 for transfer (as illustrated in FIG. 8) or user logic will be configured to act as a gateway to transfer a packet from a row to a column or vice versa.

In some example embodiments, the routers are configured as masters and forward the packets in the east or west direction, while routers configured as slaves forwarding the packet in the north or south direction. The iNOC 120 forwards the packet along the vertical or horizontal path to the correct destination.

In the illustrated example, user logic 702 communicates with user logic 704 by using one iNOC column. The user logic 702, via the local NAP, uses router 714 that forwards 710 the packet to router 716, that delivers the packet to the NAP and to the user logic 704, and vice versa.

On the horizontal transfer, the user logic 706 communicates with the user logic 708 utilizing an iNOC row. The user logic 706 transfers the packet to router 718 (via the local NAP), which transfers the packets to router 720, which transfers the packet to user logic 708 (via the local NAP), and vice versa. It is noted that, since the rows and the columns are independent, both horizontal and vertical transports may operate at maximum transmission speeds (e.g., 512 Gbps).

In this mode, the user logic communicates with another user logic utilizing any type of communications protocol, and the iNOC 120 provides a raw transfer of data.

FIG. 8 illustrates the data flow between a user-logic master and a user-logic slave, according to some example embodiments. The user logic 802, acting as master, issue packets to a router acting as a slave to deliver data to another user logic. The originating router sends the transaction to the eNOC interface at the east or west edge of the FPGA core 122, the eNOC 104 then carries the transaction to the correct column at the top or bottom of the iNOC 120, and the iNOC column delivers to the receiving router down the column.

In the illustrated example, user logic 802 sends a request 806 via router 808 (master), which forwards the transaction westbound to router 810 that interfaces with eNOC 104. The eNOC 104 transfers the request to router 812 (slave) that transfers the data down the column to router 814, which delivers the request to user logic 804 (acting as a slave).

Figure 9A:
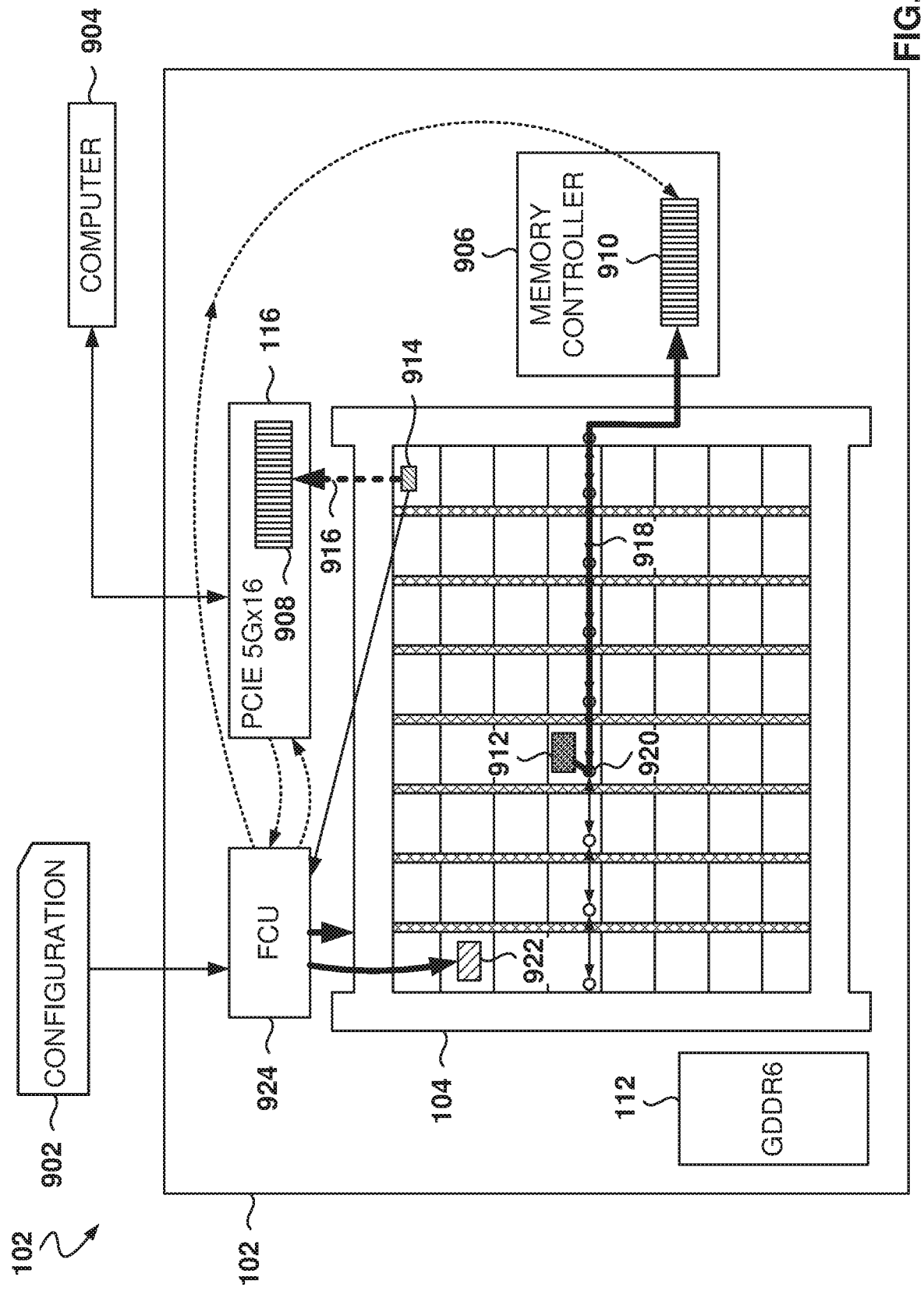
FIG. 9A illustrates the dynamic configuration of the FPGA, according to some example embodiments.

FIG. 9A illustrates the dynamic configuration of the FPGA, according to some example embodiments. Typically, a configuration 902 is sent to the FCU 924 to configure the components of the FPGA 102. This is usually done once before the FPGA 102 is used for its intended purpose.

However, sometimes it is desirable to reconfigure part of the FPGA 102 after the FPGA 102 begins operation (when the FPGA 102 has already been configured), such as for changing some parameters in the memory controller 906. Partial reconfiguration is a difficult problem for FPGA manufacturers. The task of changing some portion of the logic without changing another portion of the logic is relatively straightforward. However, problems arise when system-level constraints make partial reconfiguration impossible; for example, reconfiguring a region of logic while an adjacent piece of logic is actively being used is particularly difficult because of the relationship of the signals between the blocks being reconfigured.

For example, if a first user logic is talking to a second user logic and the communications travel through a third user logic, trying to reconfigure the third user logic would interrupt the communication between the first and the second user logics.

Some prior solutions implement a "shell" that the user logics connect to. However, this reduces the portion area in the FPGA that is usable for the core (e.g., 44% in one case), and saddles the user with problems such as routing through a non-rectangular region, keeping track of open transactions, and carefully placing signals that represent the boundaries between the user logic and the "shell."

In some example embodiments, the NOC may be used for partial reconfiguration of the user logic, and the user logic may also issue commands to perform partial reconfiguration on the FPGA. Assuming that each block of logic needs to communicate with interfaces such as PCIe, Ethernet, DDR, etc., the user designs their system so that each block of logic communicates via the NOC. In this case, a logic region within the NOC (a cluster) is reconfigured without affecting the traffic in adjacent regions. Further, it is possible to achieve true partial reconfigurability while the adjacent regions are operating.

In some example embodiments, the FCU 924 is able to issue transactions to the NOC, allowing the configuration logic to set any CSR interface on the device or do partial configuration of any user logic, such as user logic 922.

For example, a computer 904, in communication with the FPGA 102, sends a request to the FCU 924 using the PCIe controller 116. The request may be to reconfigure the PCIe controller 116 itself, and the FCU 924 will send reconfiguration bits to the PCIe controller 116 to change its configuration.

In another example, user logic 914 sends the request 916 (e.g., via the eNOC 104) to the FCU 924 for reconfiguring the configuration bits 908 of the PCIe controller 116.

Further, other elements on the FPGA 102, such as PCIe controller 116 and user logic 914 issue commands to the FCU 924, allowing for partial reconfiguration using the NOC. This means that the FPGA 102 is able to reconfigure itself without receiving an external command for reconfiguration.

In some example embodiments, components of the FPGA 102 may also issue commands to reconfigure other components of the FPGA 102, without going through the FCU 924. For example, user logic 912 sends a request 918 to memory controller 906, via router 920, to change the configuration bits 910 that regulate the behavior of the memory controller 906. The request travels through a row of the iNOC 120 and then the eNOC 104 transfers the request to the memory controller 906.

In another example, the partial reconfiguration may be used to change the configuration of the NOC routers and NAPs. For example, the router/NAP may be configured to use Ethernet packets, have a certain address, change the address translation table, set priority level, set security level, etc.

By using partial reconfiguration, it is possible to change any of these parameters of one cluster, and this is done from an internal user or from an external user.

Figure 9B:
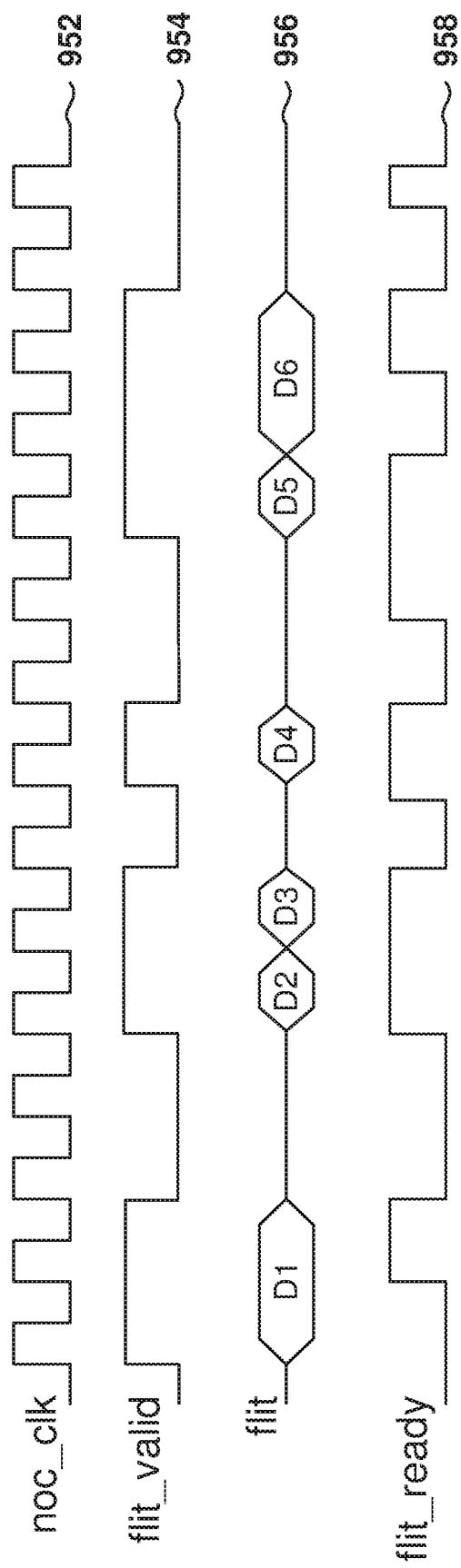
FIG. 9B illustrates the iNOC interface timing, according to some example embodiments.

FIG. 9B illustrates the iNOC interface timing, according to some example embodiments. The NOC interface timing is similar to the AXI signaling but with a few changes in the signal properties.

In some example embodiments, there are two valid signals 954 and two ready signals 958; that is, there are two valid-ready pairs, which form two virtual channels sharing the same physical wires carrying a 301-bit flit 956 in the EW iNOC and a 306-bit flit in the NS iNOC. One valid-ready pair is for a command virtual channel and the other valid-ready pair is for a response virtual channel. Additionally, only one valid signal is asserted at any time in an iNOC interface.

The valid and ready signals can be asserted independently on the router interface and in internal handshake within the node. Further, the valid signal 954 and the ready signal 958 conform to AXI protocol requirements at the NAP interface, including a clock signal 952.

This kind of interfacing, with no dependencies between valid and ready, allows for implementations that can run at very high frequencies. Additionally, this implementation also allows for high speed signals to travel the required distances (e.g., the width of a cluster) without the need for a pipeline stage; thus, keeping latency to a minimum.

Further, having two virtual channels sharing the same physical interface allows the router to choose the traffic that passes through. Further, as discussed in more detail below with reference to FIG. 12A, the router equipped with this choice avoids deadlocks by prioritizing responses over commands.

Figure 10:
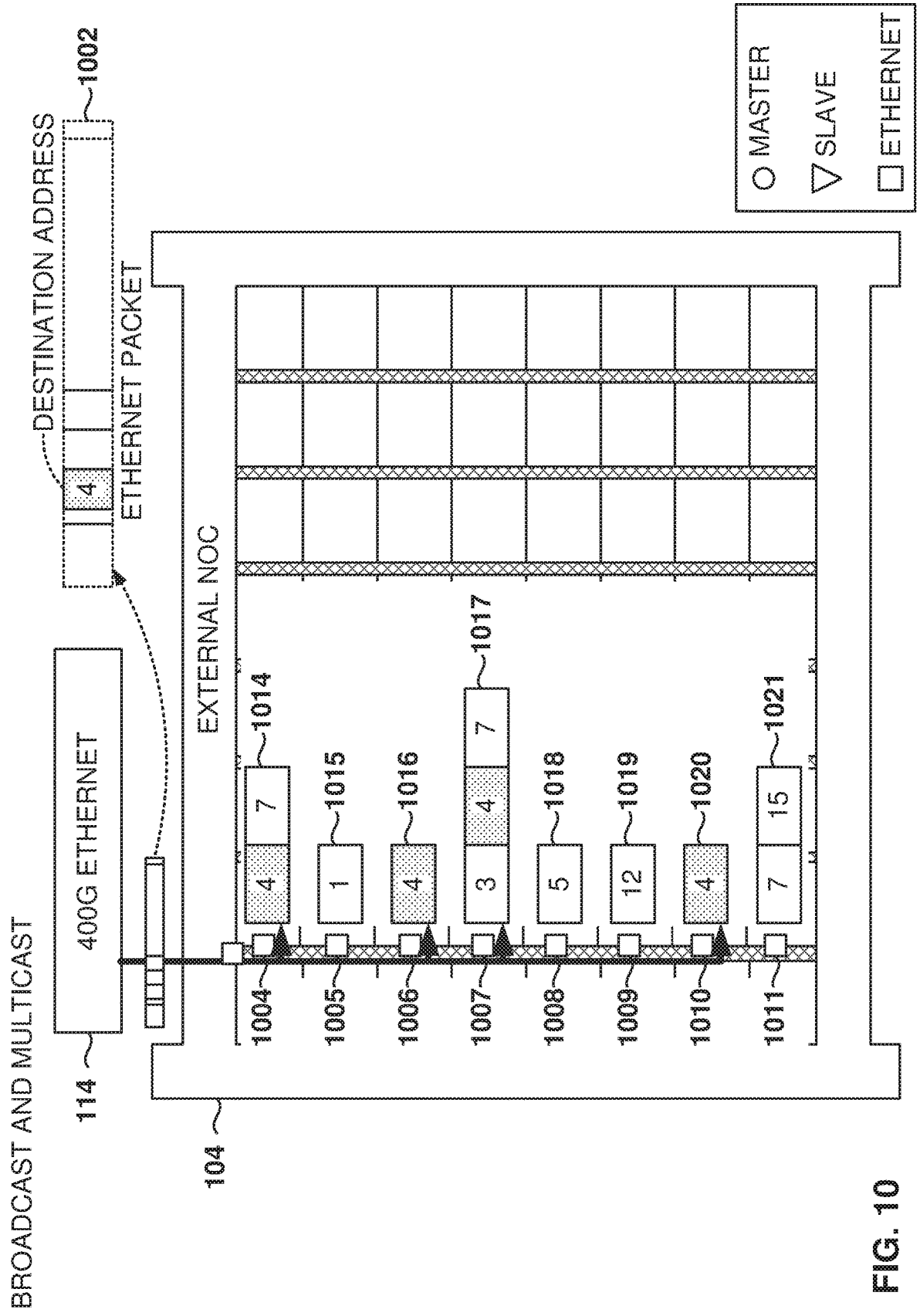
FIG. 10 illustrates broadcasting and multicasting within the iNOC, according to some example embodiments.

FIG. 10 illustrates broadcasting and multicasting within the iNOC 120, according to some example embodiments. In addition to supporting transactions, the iNOC columns carry Ethernet data. Each iNOC Ethernet Interface Unit (EIU) (part of the node router) (e.g., 1004-1011) accepts one or more streams of Ethernet traffic from the Ethernet MACs. The EIU tags the Ethernet data with the correct destination ID, based on the device configuration (e.g., the user maps physical MACs to destination nodes in the column), interleaves the data with data from other MACs, and sends packets down the column.

The EIU having a local address equal to the destination field in the iNOC column flit captures the flit, copying it into its local buffer. The AXI encapsulation/decapsulation is bypassed, and the flit is presented to the user logic as received. The start-of-packet, end-of-packet, and end-of-packet modulo indications, as well as other Ethernet control signals, are carried as part of the flit payload. For outbound Ethernet packets (from the user logic to Ethernet controller 114), the process is reversed: the user logic pushes data into the local EIU, which attaches the source ID and "North Terminal" destination ID at the top of the column and interleaves the data with other northbound flits. The source ID indicates which Ethernet MAC destination.

In some example embodiments, when the Ethernet controller 114 is operating at 400 Gbps, the Ethernet controller 114 presents to the EIU a 1024 bit-wide interface running at approximately 800 MHz. By delivering the data in either a quad-segmented interface, or as a packet steamed over time, this amount of data fits within the throughput envelope of a single iNOC column. This amount of data, however, is more than a single EIU can present to the FPGA logic. To support 400 Gbps, multi-NAP data presentation is used. For example, four EIUs work in unison, each presenting/receiving 256 bits of data, to give the customer a combined data path of 1024 bits running at approximately 500 MHz. In another example embodiment, four Ethernet frames are buffered separately and sent separately to a separate EIU, where each is streamed in a 256-bit data path at approximately 500 MHz.

To support multi-NAP data presentation, the EIU takes the 1024-bit interface from the 400 Gbps MAC core and splits it into four parallel streams of 256 bits each. Each of these streams operate into the 2 GHz domain, have a unique destination ID attached, and are interleaved with one another to be sent down the column, where they are picked up by a respective EIU. In other embodiments, to support a slower fabric speed, the Ethernet packets presented in this way are quad segmented, such that any of the destination/source NAPs gets the beginning or end of the packet. This adds complexity but allows the design to run at a slower speed.

When the Ethernet controller 114 is operating at 200 Gbps, the Ethernet controller 114 presents a 1024-bit wide interface running at approximately 400 MHz (alternatively, running at approximately 800 MHz where more than half the cycles are idle). When converted to a quad segmented interface, this amount of data fits within the throughput envelope of a single iNOC column. This amount of data, however, is more than a single EIU can present to the FPGA logic. Depending on the configuration, the 200 Gbps stream is presented as a quad segmented interface to four NAPs, or as a packet steaming interface to four NAPs or two NAPs.

For Ethernet operating at 100 Gbps and less, the Ethernet controller 114 presents a 256-bit interface to the EIU. The EIU crosses this data into the 2 GHz iNOC clock domain and enters a small switching network to be sent to one of the two destination columns. Additionally, there is also one 100G interface per Quad MAC that buffers up packets.

As in other networks, communications in the NOC use addresses to identify nodes in the network. Thus, the different nodes of the NOC (e.g., Ethernet, PCIe, DDR, NAP) are assigned addresses, and the NOC is responsible for address decoding to determine where a request goes and to get the request to the correct location.

In some example embodiments, each router includes an address translation table that allows the base address, also referred to as the local address, of each endpoint (router/NAP or IP core) to be independent of its physical location. Thus, when the router receives a packet having as destination address one of the local addresses of the router, the router delivers the packet (or flit) to the local NAP.

The address translation table translates destination addresses to physical addresses of elements in the NOC. While the physical addresses are unique, the same destination address may be mapped to more than one node (e.g., NAP) that uses that destination address as a local address. Thus, the address space for the NOC is completely configurable because the address translation tables of the NAPs are also configurable.

The address translation table in each NAP allows the destination location of each node or IP core to be looked up as a function of the address with each transaction issue. The address translation table allows the memory map seen by each NAP to be independent of that seen by other NAPs. This allows, for example, one accelerator (user logic) to see its private memory at a given base address, and a different accelerator to see its memory at the same base address, while the system has actually allocated memory independently for each accelerator.

This address translation table is also used to provide security, such that if some portion of user logic coupled to a given NAP is not enabled to access some other NAP, an IP core, the FCU, or some other address space, the disabled portion of the address space will be marked inaccessible in the address translation table for that given NAP.

The flexibility of configurable address translation tables enables the implementation of multicast and broadcast addressing schemes because each NAP supports multiple local addresses simultaneously. Broadcast in a column, for example, may be implemented by assigning the same local address to each NAP in the column as one of their addresses, such that if a flit arrives with the broadcast address to the NAP, the NAP will deliver the flit locally.

In prior FPGA broadcast implementations, the broadcast packet had to be sent separately to each of the recipients of the broadcast, which would mean two or more packets being sent, instead of just one.

Similarly, a broadcast address may be assigned to all the NAPs at the top of the columns that are connected to the eNOC 104. The packages may then be broadcasted throughout all the columns. Further, broadcast may be implemented across one row of the iNOC 120, or across multiple rows of the iNOC 120.

Multicast is like broadcast, but only a subset of the NAPs share a given local address. In the example illustrated in FIG. 10, multiple NAPs in the same column are assigned the same local address 4, that is NAPs 1004, 1006, 1007, and 1010. It is noted that the NAPs may have additional addresses that are different from other NAPs.

When a packet 1002, with destination address 4, is sent down the iNOC column, the NAPs 1004, 1006, 1007, and 1010 will determine that the packet is addressed to one of its local addresses and deliver 1002 the packet to the local NAP. Thus, one packet is used to multicast to multiple nodes on the network.

It is noted that broadcast and multicast may be implemented for multiple transport mechanisms, such as Ethernet and AXI. Further, because the network address tables are reconfigurable, as described above, broadcast and multicast addresses may be added, modified, or deleted while the FPGA is operating.

One use example is in applications related to machine learning. In machine learning, matrix multiplication is used frequently, and weights are used to identify optimized functions for the training and inference used in machine learning. The weights used for matrix multiplication may be used in multiple user logic areas; therefore, using multicasting is a good way of transmitting weight parameters to multiple user logic areas.

FIG. 11 illustrates the interleaving of flow control units (flits) during transport, according to some example embodiments. As discussed above, in some example embodiments, there is a router 1113, 1114 for each direction and each router 1113, 1114 has a 2:1 multiplexor (mux) 1106 to merge the traffic 1110 from the local node (e.g., user logic 1102) with the traffic 1108 already on the horizontal bus in the respective direction. As each packet arrives to the router 1113, 1114, a field in the packet is used to determine if the packet is forwarded or if it is delivered to the respective NAP 1111, 1112.

The mux 1106 is used to mix the flits from the horizontal traffic with the flits from the user logic 1102, a process which is referred to as interleaving. The result is traffic 1104 that includes mixed (e.g., interleaved) flits from the local node and the traffic from other nodes passing through the router 1114.

Flits of different kinds may be interleaved, such as read requests and write responses (single-cycle flits), write requests, and read responses. With reference to write requests, AXI does not support interleaved writes. With the iNOC, the AXI interface to the NAP has the same limitation, but the data transferred on the high-speed NOC interface allows complete interleaving of flits. When the user logic is the master, the flits that constitute a write transaction are reassembled on the edge of the FPGA core before issuing to the eNOC. It also means that transactions do not need to be buffered inside the router 1114 before the transactions are sent because the transactions are "dribbled" (e.g., transmitted in separate flits) onto the high-speed eNOC from the low-speed NAP without blocking traffic to/from other nodes. The total buffering required at the row endpoints NAP is what would otherwise be required inside the router 1114. Further, the total memory required is doubled since the reassembly buffer exists at both east and west endpoints, but this scheme is more efficient because the memory is a single memory of a large size instead of having to add memory at all the routers in the row.

With reference to read responses, AXI supports interleaved read responses. This simplifies the implementation of the iNOC, since it freely interleaves in both the FPGA-as-master and FPGA-as-slave scenarios. In both cases, the AXI transaction ID is sufficient to reassemble responses at the destination. Further, in the case of read responses from different directions, responses may come back interleaved, but must return ordered with respect to the transaction ID.

If two packets are sharing a link in the NOC, but are destined for different endpoints, it is desirable that the two packets affect one another as little as possible. In this case, cycle-by-cycle interleaving may be ideal, as each flow will see its share of the available throughput with minimum jitter. This also allows minimizing FIFO memory requirements.

With AXI, responses to multiple read requests with a given transaction ID must be returned in the same order. Likewise, responses to multiple write requests with a given transaction ID must be returned in the same order. In general, there are no order requirements between read transactions and write transactions with the same transaction ID.

For a stream of requests that are going to the west, the iNOC 120 maintains request flit ordering from a given user logic issue point until the transactions are issued to the eNOC 104 to the west. The western eNOC then guarantees that correct ordering is maintained as responses are returned. The same is true for a stream of requests to the east.

Each router 1114 has a routing algorithm to determine where an incoming flit, or stream, is to be transferred. In some example embodiments, the routing algorithm supports multiple traffic classes. FIG. 11 illustrates one queue associated with mux 1106, but other queues are also available for different traffic classes (not shown), where each traffic class has its own queue and will interleave data from the corresponding queue. This allows the routers to support quality of service (QOS) for traffic.

Arbitration logic at the router decides which packet, from which queue. is transferred next towards the next router. In some example embodiments, the routers utilize wormhole routing, which is a system of flow control in computer networking based on known fixed links. Typically, the first flits, called the header flits, hold information about the packet's route (e.g., the destination address) and sets up the routing behavior for all subsequent flits associated with the packet. The header flits are followed by zero or more body flits which contain the actual payload of data. Some final flits, called the tail flits, perform some bookkeeping to close the connection between the two nodes.

In wormhole switching, each buffer is either idle, or allocated to one packet. A header flit is forwarded to a buffer if this buffer is idle. This allocates the buffer to the packet. A body or trailer flit is forwarded to a buffer if this buffer is allocated to its packet and is not full. The last flit frees the buffer. If the header flit is blocked in the network, the buffer fills up, and once full, no more flits can be sent. This effect is called "back-pressure" and is propagated back to the source.

The name "wormhole" comes from the way packets are sent over the links because the header of given packet has left the router before the tail arrives. This means the router sets up quickly the routing of the actual message. Since a packet is transmitted flit by flit, it may occupy several flit buffers along its path, creating a worm-like image.

Therefore, unlike a store and forward mechanism, the transmission of a flit out of the router may start even before the complete packet (which may include several flits) has arrived to the router.

Because of interleaving, the flits from a packet may not arrive together at the destination. However, the NOC implementation guarantees that the flits arrive in order at the destination because all the flits follow the same path. Once the flits have arrived, the destination reassembles the flits to form the packet.

Figure 12A:
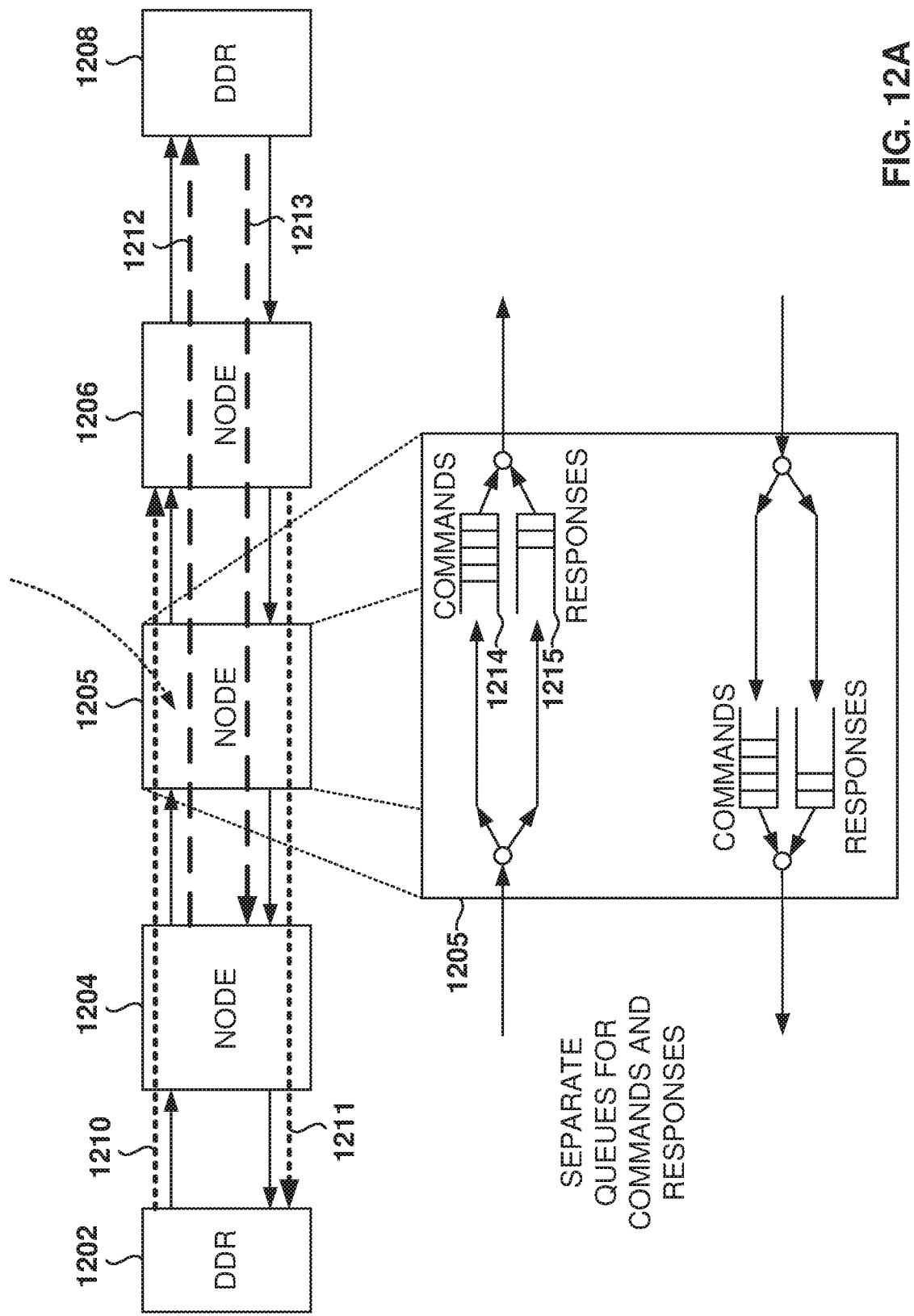
FIG. 12A illustrates the use of separate queues for commands and responses to avoid communications deadlock, according to some example embodiments.

FIG. 12A illustrates the use of separate queues for commands and responses to avoid communications deadlock, according to some example embodiments. Deadlock is an important consideration for any network, including the FPGA NOC. The NOC could have a deadlock scenario under some circumstances if mechanisms are not put in place to avoid deadlock.

For example, node 1206 is sending read requests 1211 to DDR 1202, which sends responses 1210, and node 1204 is sending read requests 1212 to DDR 1208, which sends responses 1213. The traffic for these communications passes through node 1205. Under a scenario where the requests and the responses are queued without prioritization and under heavy traffic, buffers in node 1205 may get full. Responses may not get through because the buffers are full and there are additional requests on the buffers. There is a partial allocation of buffers for responses, but the responses are not completed because of the congestion. A circular dependency with partial allocation of resources may take place, resulting in deadlock.

In some example embodiments, in order to avoid the deadlock scenario, different queues 1214, 1215 are implemented at the routers, where one queue 1214 is for queuing commands and another queue 1215 is for queuing responses. Thus, the incoming traffic is separated into commands and responses and then merged again on the way out of the router.

The response queue 1215 is given a higher priority than the command queue 1214, such that commands may be blocked temporarily but the responses keep going through; that is, the responses are transmitted ahead of the commands. The commands that originated these responses will complete, with the consequent freeing of resources that breaks the partial allocation and circular dependency that would cause the deadlock.

Figure 12B:
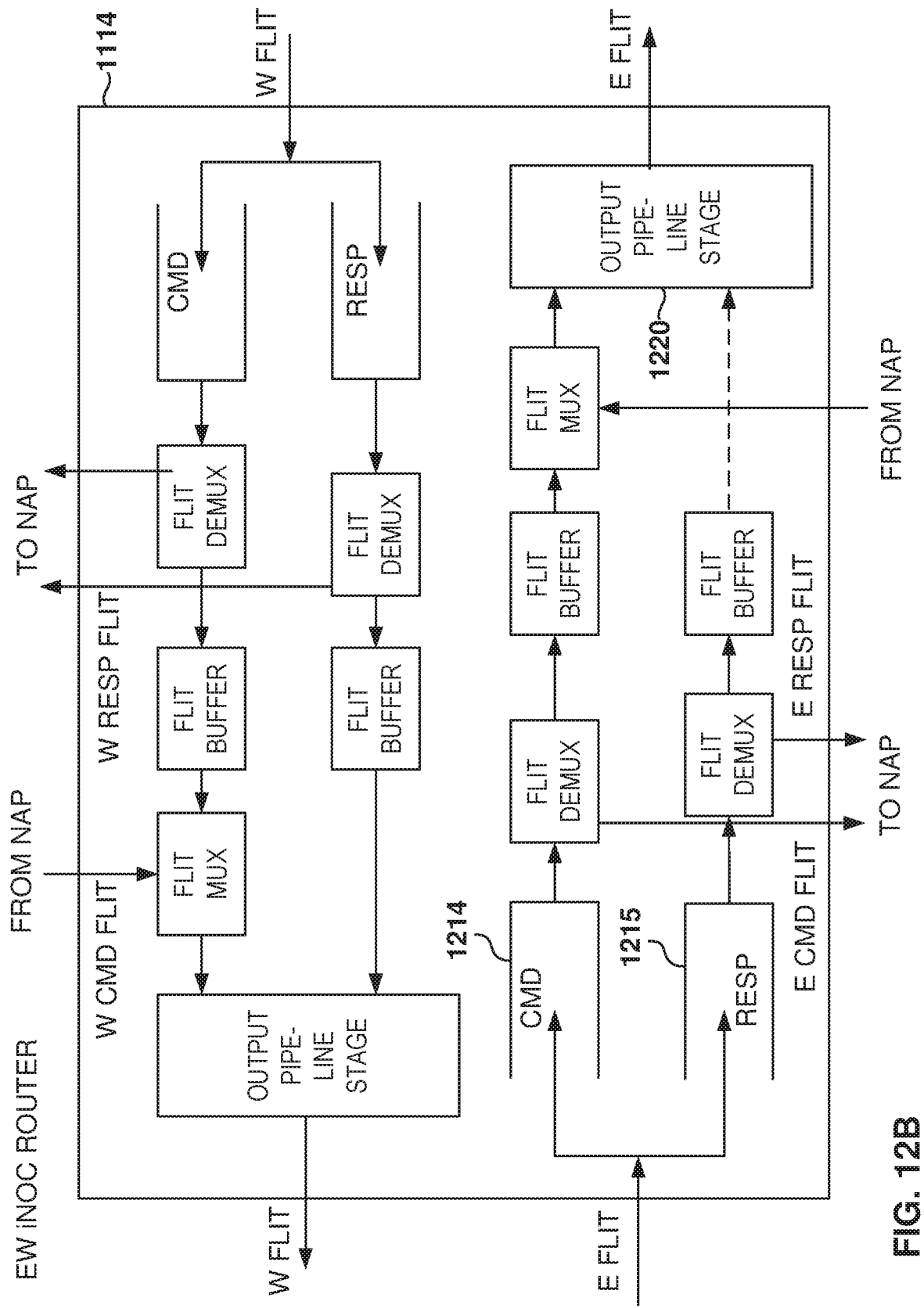
FIG. 12B illustrates an architecture of the EW iNOC router, according to some example embodiments.

FIG. 12B illustrates an architecture of the EW iNOC router, according to some example embodiments. In some example embodiments, in the router, the incoming data enters registers directly and the outgoing data is driven directly out of the registers. Thus, the router is built as two separate channels that converge at the output stage, where a registered output is driven out on the high-speed interface.

The iNOC router 1114 decides if incoming flits (coming in from the East or the West) are consumed at the node (e.g., sent to the local NAP) or forwarded to the next node.

Further, as discussed above, the iNOC router 1114 has separate paths for command flits and response flits in each direction. These paths are referred to as channels and avoid deadlock conditions. The two channels converge at the output pipeline stage 1220.

It is noted that, in some example embodiments, the NS NOC has a similar architecture to the EW NOC, but for flits traveling North or South instead of East or West.

Figure 12C:
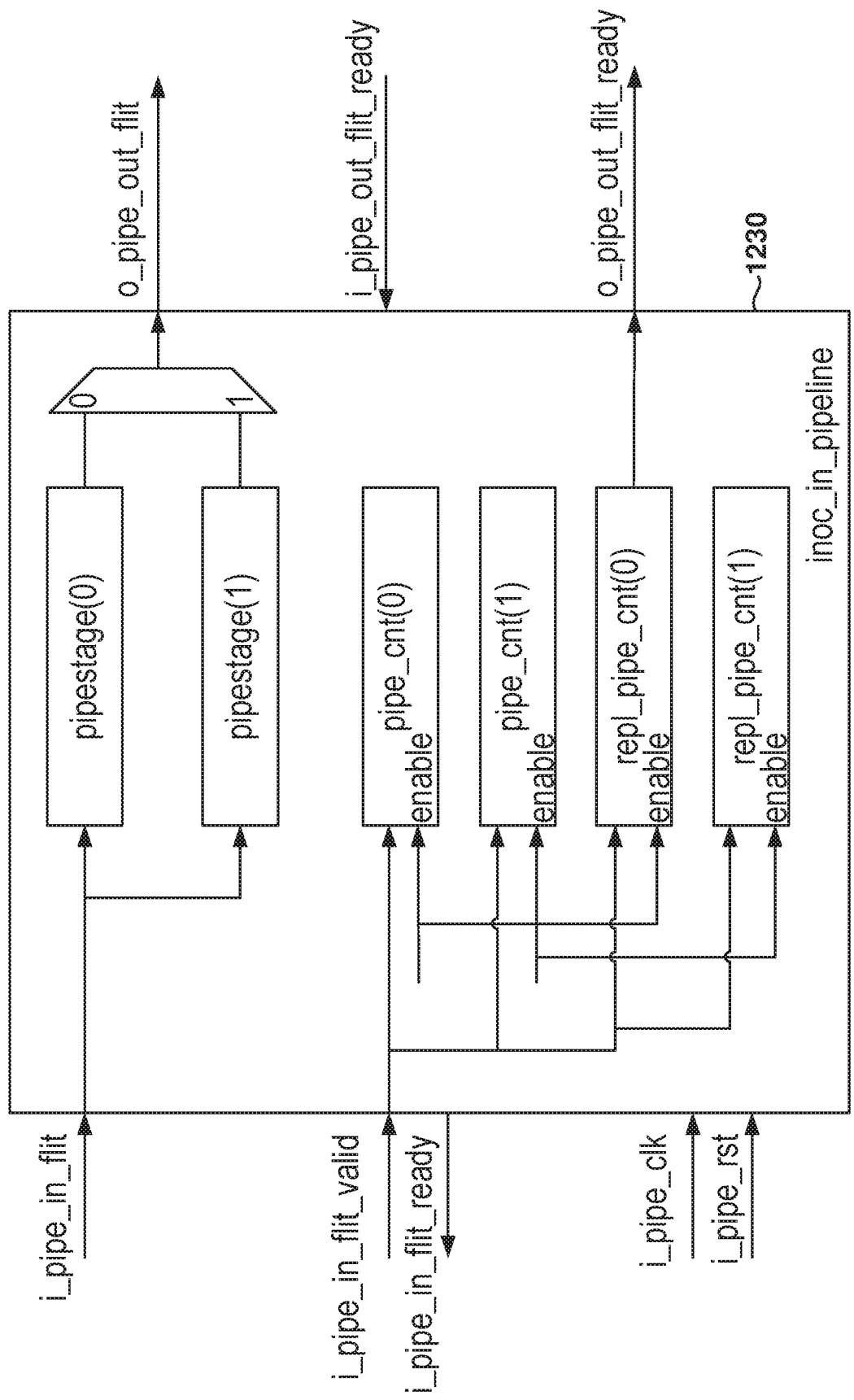
FIG. 12C is a diagram of an input pipeline stage, according to some example embodiments.

FIG. 12C is a diagram of an input pipeline stage 1230, according to some example embodiments. The target frequency of implementation of the EW NOC router is 2 GHz, and 2.027 GHz for the NS iNOC to support Ethernet packet transfers, in some example embodiments.

In the EW NOC, the distance from one router to the next router is equal to the width of a core fabric cluster 118, which means that the input and output pipeline stages have to meet input/output (IO) timing constraints.

In the NS NOC, the distance from one router to the next router is the height of the cluster (e.g., from the North boundary to the South boundary). This means that the input and output pipeline stages have to meet timing constraints in NS NOC as well.

The input pipeline stage 1230 includes space for two flits, and the ready-signal is driven directly from a counter. The input pipeline stage 1230 acts as a ping-pong buffer where the data is accepted into either stage based on the write pointer. Further, along with the write pointer and a read pointer, the counter is also used, which is implemented as a gray coded counter in some example embodiments.

Further, the input pipeline stage 1230 is implemented separately for each channel, which is one of the reasons why the iNOC flits have two valid signals, e.g., two virtual channels.

Having two separate valid signals and ready signals enables this design choice and reduces the fanout on the valid signal, which acts as a control signal. In the input pipeline stage, the valid signal fans out to the control logic, which includes four, or less, flops. In some example embodiments, the ready control signal is generated directly out of a flop, and each of the data signals (e.g., the flit signals) fan out to four 4 flops.

In some example embodiments, the input pipeline stage 1230 implementation is to have only fanouts on the incoming flit valid signal. However, the synthesis tool may generate logic that does not use flops with a synchronous enable signal.

Figure 12D:
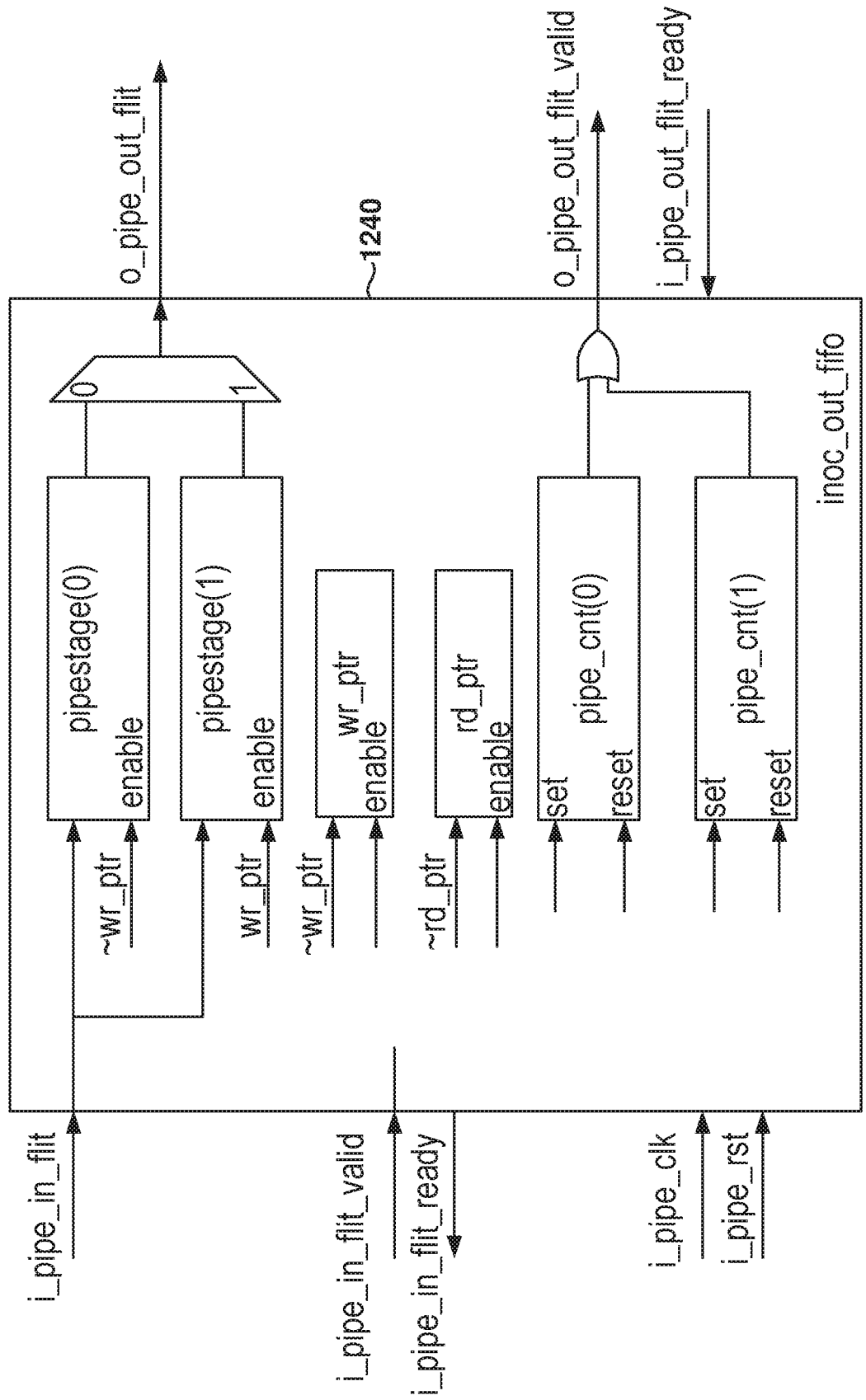
FIG. 12D illustrates the outgoing first-in first-out (FIFO) stage of the output pipeline stage, according to some example embodiments.

FIG. 12D illustrates the outgoing first-in first-out (FIFO) stage 1240 of the output pipeline stage, according to some example embodiments. In the output pipeline stage, there is space for four flits in the form of two FIFO stages and a stage to drive the outgoing flit interface. One FIFO stage holds two command flits and one FIFO stage holds tow response channel flits. FIG. 12D illustrates one of the FIFO stages 1240.

Figure 12E:
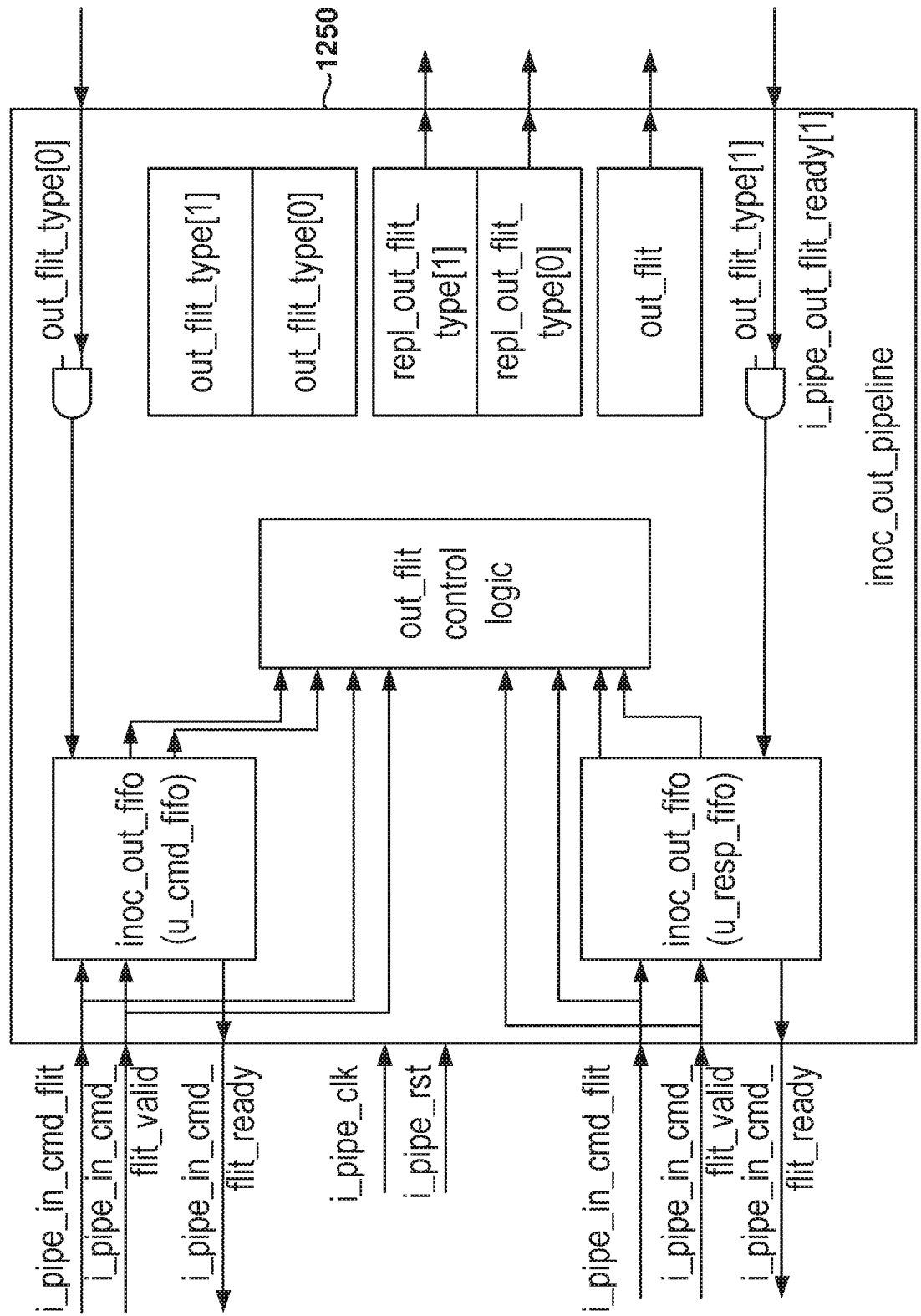
FIG. 12E illustrates the output pipeline stage, according to some example embodiments.

FIG. 12E illustrates the output pipeline stage 1250, according to some example embodiments. To avoid needing a multiplexer and an arbiter in the outgoing flit path, which would worsen the IO timing requirements, the output pipeline stage 1250 has a different design than the input pipeline stage To meet the IO timing requirements, the output pipeline stage 1250 drives flits directly from flops. Additionally, the command and response valid signals are driven out of flops with as small fanout, and logic, as possible. The incoming control signal ready must also have a smaller fanout as possible with as little combinational logic as possible. The output pipeline stage also satisfies all these requirements and does not add latency in the path.

The output pipeline stage 1250 drives the flit directly out of a flop, and the control logic filling the flit type, in the output flit stage, is indicated through a flop-pair out_flit_type[0] and out_flit_type[1]. These two flops are used by the internal logic for fanouts and to drive the combinational logic.

Another flop pair is used to drive valid replies, repl_out_flit_type[0] and repl_out_flit_type[1]. In some example embodiments, the two pairs of flops have the same structure. The flops in both flop-pairs are not set to a value of "1" at the same time, and the two flop-pairs are implemented to avoid additional fanout that could degrade timing. Further, the bit-0 of the out_flit_type, and the repl_out_flit_type, represents a valid command and bit-1 represents a valid response.

In some example embodiments, the control logic that fills the output pipeline stage 1250 is defined as follows:

If the response FIFO is full then out_flit stage is filled with a flit from the response FIFO, and the out_flit_type is set to "10;"

Otherwise, if the command FIFO is full, the response FIFO is empty, and there is no incoming response flit, then the out_flit stage is filled with a flit from the command FIFO and the out_flit_type is set to "01;"

Otherwise, if the response FIFO is empty and there is an incoming response flit, then the out_flit stage is filled with an incoming response flit and the out_flit_type is set to "10;"

Otherwise, if the response FIFO is empty and there is no incoming response flit and there is an incoming command flit, then the out_flit stage is filled with an incoming command flit and the out_flit_type is set to "01."

When either of the FIFO stages is full, it means that the next router is not able to accept any more flits. At this point, new data is not accepted into the FIFO stage until the respective FIFO stage is emptied. Further, flits are logged into the FIFO stages when the next stage is not accepting the flits, which avoids any additional latency incurred if the FIFO stages are filled with flits.

The out_flit_type and repl_out_flit_type flops are free flowing flops and do not need clearing as the FIFOs are maintained based on the corresponding ready status.

Further, in some example embodiments, if a command is in the out_flit flop but ready is not asserted, and if a response flit is available, the command FIFO still holds the command but the out_flit flit is replaced with an incoming response. The command is presented at the output again when there are no responses incoming and the response FIFO is empty.

Further yet, when the responses are infrequent and commands are already filled up in the command FIFO, whenever a response is available, the response occupies the out_flit flop and is allowed to pass through, which allows for the optimum use of the available bandwidth.

This architecture allows for significantly better results (e.g., higher performance of the router) when compared to a conventional mechanism with a multiplexer-arbiter structure at the output stage.

Figure 13:
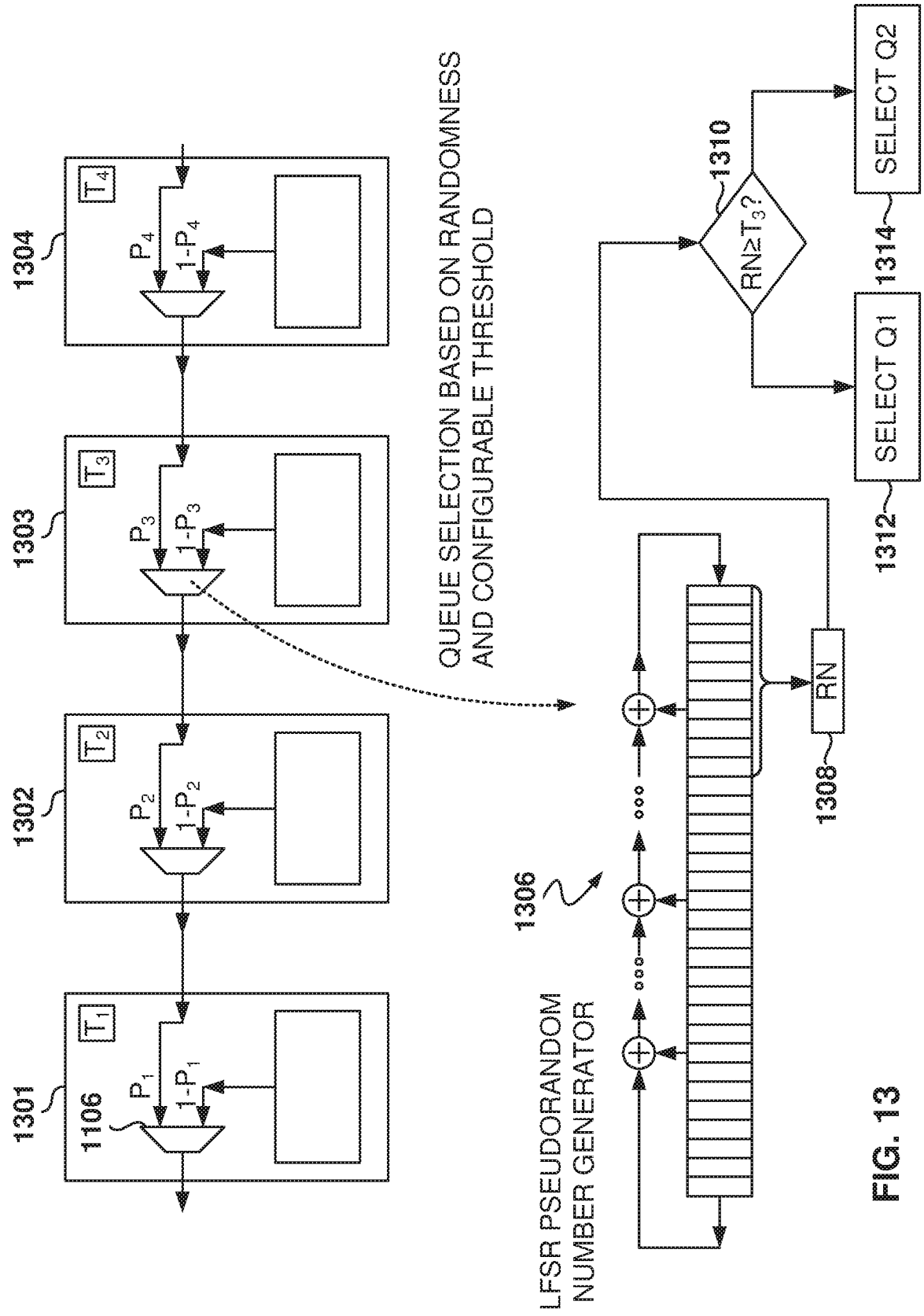
FIG. 13 illustrates arbitration for flow controller at each router using a pseudorandom number generator and configurable thresholds, according to some example embodiments.

FIG. 13 illustrates arbitration for flow controller at each router using a pseudorandom number generator 1306 and configurable thresholds, according to some example embodiments. FIG. 13 illustrates a portion of the network that includes four nodes 1301-1304. Illustrated is the traffic in the eastbound direction, where the traffic from nodes to the left is interleaved with the local traffic generated within the node.

If a simple 50-50 allocation was used to merge the traffic passing through with the local traffic, then the throughput from a node to the east would be split in half at each router, which means that the nodes to the east would get less bandwidth than the nodes on the west for the traffic flowing west.

In some example embodiments, weighted round robin arbitration is used at each node to implement a fair arbitration scheme for traveling flits. Every cycle, each router in the row has an arbitration choice between traffic from the previous router in the chain, and traffic from its local NAP. To fairly distribute traffic from the farthest source to the endpoints (e.g., the router on the far east of the row sending traffic to the endpoint on the west), each sequential router along the route gives more priority to the traffic from its neighbors.

For example, for westbound traffic from the router furthest to the east, the router furthest to the east gives one half of the bandwidth to its local NAP and one half to the traffic flowing from the east endpoint. The next router to the west gives ⅓ bandwidth to its router and ⅔ bandwidth to westbound traffic. And the bandwidth allocated to the local NAP continues to be reduced for routers to the west. The traffic flowing through the router further west in the row to the west endpoint allocates ⅑ of the bandwidth to its local nap and 9/10 to incoming traffic from the east (when there are 9 nodes on the horizontal row of the iNOC).

This allocation may be formulated as allocating 1/(1+N) of the traffic to the local NAP and the rest to the traffic flowing through, where N is the ordinal of the router in the row. In the example of westbound traffic, the router on the eastern edge has N=1, the next router to the west has N=2, and so forth until the router on the western edge, which has N=9.

In some example embodiments, the bandwidth allocation is configurable for each node. For example, node 1301 allocates a fraction $P_1$ (e.g., 80%) to through traffic and $(1-P_1)$ (e.g., 20%) to local traffic, node 1302 allocates a fraction $P_2$ (e.g., 70%) to through traffic and $(1-P_2)$ (e.g., 30%) to local traffic, etc.

The probability $P_i$ at each node is then configurable to provide the best allocation for the expected traffic pattern in the configuration selected by the user.

In some example embodiments, the implementation of the $P_i$ is done by allocating a $P_i$ percentage of packets to through traffic and the rest to local traffic. For example, if $P_i$ is 30%, out of 10 packets, the first 3 packets are allocated to through traffic and the next seven packets are allocated to local traffic. The allocation may also alternate packets within the ten-packet cycle.

However, fixed allocations may result in some undesirable traffic patterns, such as cyclical patterns. To avoid this, a pseudorandom number generator 1306 is used to generate a random number RN 1308, and the random number RN 1308 is used to allocate packets at the router. Because the allocation is based on a seemingly random pattern, the possibility of creating cycles or resonance in the data is eliminated.

In some example embodiments, the pseudorandom number generator 1306 is implemented in hardware utilizing a linear-feedback shift register (LFSR). The LFSR is a shift register whose input bit is a linear function of its previous state. In addition to shifting bits, a linear function is used to calculate the input bit on one end based on the values of multiple bits in the LFSR. The linear function may use exclusive-or (XOR) operations on selected bits. Thus, an LFSR is most often a shift register whose input bit is driven by the XOR of some bits of the overall shift register value.

The initial value of the LFSR is called the seed, and because the operation of the register is deterministic, the stream of values produced by the register is determined by its state. Further, because the register has a finite number of possible states, it must eventually repeat the cycle of outputs. An LFSR with a well-chosen feedback function produces a sequence of bits that appears random and has a very long cycle.

In some example embodiments, a 32-bit LFSR is selected, but other register sizes are also possible. The whole value of the register may be used or a subset of the bits in the LFSR. In some example embodiments, the ten least significant bits are used (or some other subset often bits) to generate the RN 1308.

Each router includes a configurable threshold parameter $T_i$ used to determine the packet allocation at the router. For each queue selection cycle, a check is made (operation 1310) to determine if RN is greater than, or equal to, $T_i$. If RN is greater than, or equal to, Ti, then the second queue $Q_2$ for local traffic is selected (operation 1314), and if RN is less than Ti, then the first queue $Q_1$ for throughput traffic is selected (operation 1312).

The 10-bit RN has values from 0 to 1023. $T_i$ is related to $P_i$, such that $T_i$ determines the percentage of packets allocated to the throughput traffic. For example, if $T_i$ is set at 409, then Q1 is selected about 409/1024 times or about 40% of the time and $Q_2$ about 60% of the time. Thus, the $T_i$ of each router may be configured to determine the percentage of traffic selected from each queue.

In another example embodiment, fixed bits on a register are configured to determine queue selection in a rotating schedule. For example, the queue is selected at each cycle based on the value of a bit in the register: if the bit is 0, then $Q_1$ is selected, and if the value is 1, then $Q_2$ is selected. The next cycle, the next bit in the register is used to select the queue, and the cycle will then repeat every 32 bits. The number of bits with a value of zero determines the percentage of packages selected from $Q_1$.

By configuring the values of bits in the register, it is possible to control packet allocation. For example, by setting one third of the bits to 0, then $Q_1$ will be selected one third of the times. Further, by setting different distributions of bit values in the different nodes, it is possible to minimize the occurrence of undesired cyclical or synchronized traffic patterns.

FIG. 14 is a flowchart of a method 1400 implementing a network on chip (NOC), according to some example embodiments. While the various operations in this flowchart are presented and described sequentially, one of ordinary skill will appreciate that some or all of the operations may be executed in a different order, be combined or omitted, or be executed in parallel.

At operation 1402, a programmable integrated circuit receives a configuration for the programmable integrated circuit, the programmable integrated circuit comprising a plurality of clusters disposed on a plurality of cluster rows and a plurality of cluster columns, each cluster comprising programmable logic; an internal network on chip (iNOC) comprising iNOC rows and iNOC columns; and an external network on chip (eNOC) outside the plurality of clusters. Each iNOC row is configured for transporting data and comprising connections to clusters in a cluster row and the eNOC, and each iNOC column is configured for transporting data and comprising connections to clusters in a cluster column and the eNOC.

From operations 1402, the method 1400 flows to operation 1404 for configuring the programmable integrated circuit based on the configuration.

From operation 1404, the method 1400 flows to operation 1406 for providing communications, utilizing a combination of iNOC and eNOC communications, to enable any cluster to communicate to any other cluster and to communication modules with external interfaces coupled to the eNOC.

In one example, the programmable integrated circuit further comprises a plurality of communication modules with external interfaces for exchanging data external entities. The communication modules are connected to the eNOC and configured for communication with the plurality of clusters via the eNOC.

In one example, the iNOC rows comprise master connections to clusters and to the eNOC, and the iNOC columns comprise slave connections to clusters and to the eNOC.

In one example, each cluster includes, for each direction of iNOC row traffic, a router and a network access point (NAP) that connects to user logic in the cluster.

In one example, the iNOC is configured for communications of multiple traffic types including packet transfer, data streams, and raw user data.

In one example, the method 1400 further comprises transferring, by the iNOC, packets by dividing the packets into one or more flits.

In one example, the method 1400 further comprises sending, from a first user logic in master mode, a read request to a slave memory controller in slave mode. The read request is sent through the iNOC row connected to the first user logic to the eNOC and from the eNOC to the slave memory controller.

In one example, an Ethernet controller is coupled to at least one iNOC column, where flits used for communication in the at least one iNOC column encapsulate Ethernet packets.

Another general aspect is for a programmable integrated circuit that comprises a plurality of clusters, an internal network on chip (iNOC), and an external network on chip (eNOC) outside the plurality of clusters. The plurality of clusters is disposed on a plurality of cluster rows and a plurality of cluster columns, each cluster comprising programmable logic. Further, the iNOC comprises iNOC rows and iNOC columns. Each iNOC row is configured for transporting data and comprising connections to clusters in a cluster row and the eNOC, and each iNOC column is configured for transporting data and comprising connections to clusters in a cluster column and the eNOC.

In one example, the programmable integrated circuit further comprises a plurality of communication modules with external interfaces for exchanging data external entities. The plurality of communication modules are connected to the eNOC and configured for communication with the plurality of clusters via the eNOC.

In one example, the iNOC rows comprise master connections to clusters and to the eNOC, and the iNOC columns comprise slave connections to clusters and to the eNOC.

In one example, each cluster includes, for each direction of iNOC row traffic, a router and a network access point (NAP) that connects to user logic in the cluster.

In one example, the iNOC is configured for communications of multiple traffic types including packet transfer, data streams, and raw user data.

In one example, the iNOC is configured for transferring packets that are divided into one or more flits.

In one example, a first user logic in master mode is configured for sending a read request to a slave memory controller in slave mode, the read request being sent through the iNOC row connected to the first user logic to the eNOC and from the eNOC to the slave memory controller.

In one example, a combination of iNOC and eNOC communications enable any cluster to communicate to any other cluster and to communication modules with external interfaces coupled to the eNOC.

In one example, an Ethernet controller is coupled to at least one iNOC column, wherein flits used for communication in the at least one iNOC column encapsulate Ethernet packets.

In one example, a PCIe controller connected to the eNOC is configured for sending a request to a second user logic in slave mode, the request being sent through the eNOC to an iNOC column, connected to the second user logic, which forwards the request to the second user logic.

In one example, a PCIe controller, connected to the eNOC, communicates to a memory controller, connected to the eNOC, via the eNOC without utilizing any cluster from the plurality of clusters.

In yet another general aspect, a machine-readable storage medium (e.g., a non-transitory storage medium) includes instructions that, when executed by a machine, cause the machine to perform operations including receiving, at a programmable integrated circuit, a configuration for the programmable integrated circuit. The programmable integrated circuit comprises: a plurality of clusters disposed on a plurality of cluster rows and a plurality of cluster columns, each cluster comprising programmable logic; an internal network on chip (iNOC) comprising iNOC rows and iNOC columns; and an external network on chip (eNOC) outside the plurality of clusters, each iNOC row configured for transporting data and comprising connections to clusters in a cluster row and the eNOC, each iNOC column configured for transporting data and comprising connections to clusters in a cluster column and the eNOC. Further, the machine performs operations comprising configuring the programmable integrated circuit based on the configuration, and providing communications, utilizing a combination of iNOC and eNOC communications, to enable any cluster to communicate to any other cluster and to communication modules with external interfaces coupled to the eNOC.

Figure 15:
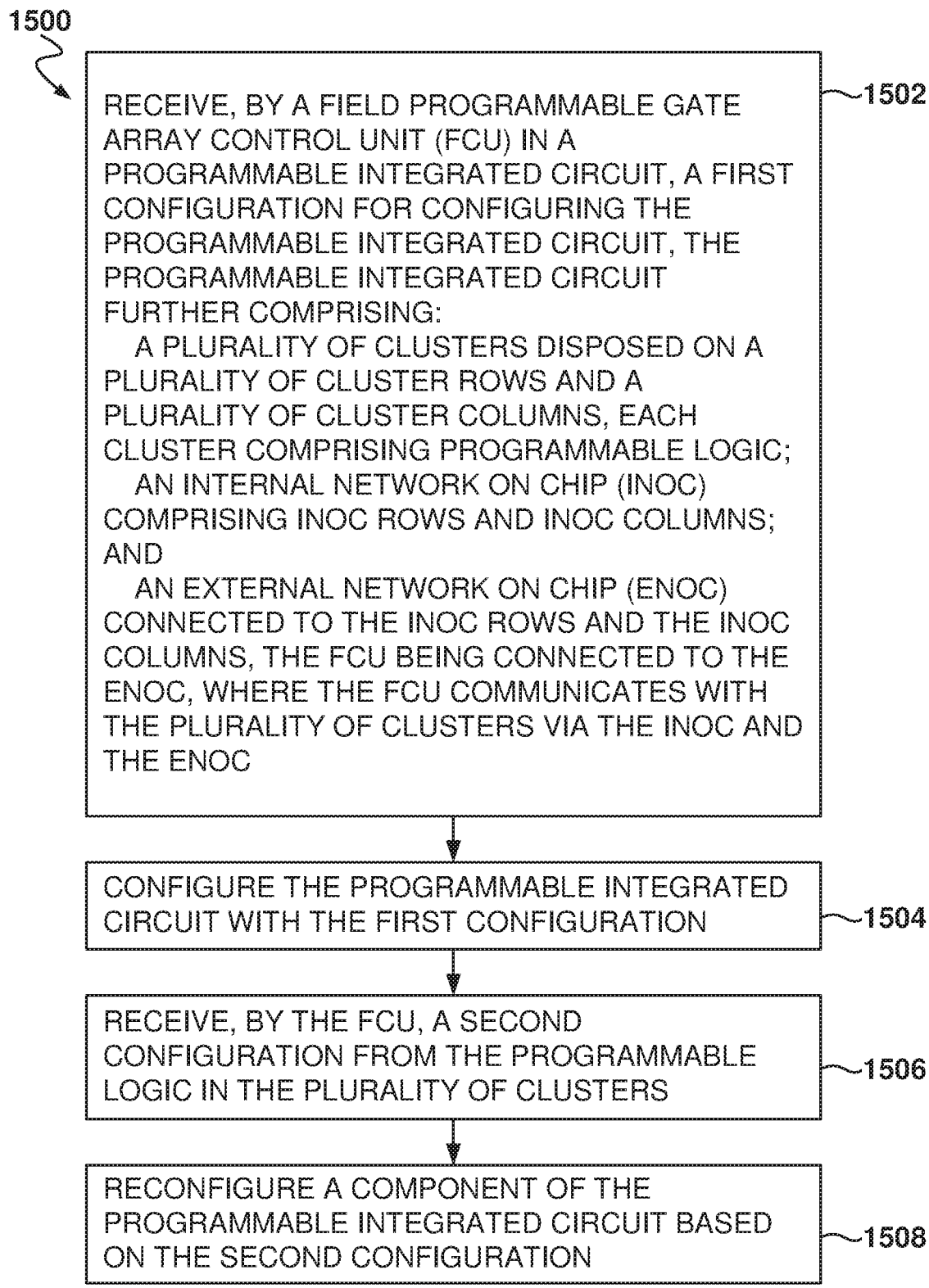
FIG. 15 is a flowchart of a method for programming the FPGA, according to some example embodiments.

FIG. 15 is a flowchart of a method 1500 for programming the FPGA, according to some example embodiments. While the various operations in this flowchart are presented and described sequentially, one of ordinary skill will appreciate that some or all of the operations may be executed in a different order, be combined or omitted, or be executed in parallel.

At operation 1502, an FCU, in a programmable integrated circuit, receives a first configuration for configuring the programmable integrated circuit, where the programmable integrated circuit further comprises: a plurality of clusters disposed on a plurality of cluster rows and a plurality of cluster columns, each cluster comprising programmable logic; an iNOC comprising iNOC rows and iNOC columns; and an eNOC connected to the iNOC rows and the iNOC columns. The FCU is connected to the eNOC, and the FCU communicates with the plurality of clusters via the iNOC and the eNOC.

From operation 1502, the method 1500 flows to operation 1504 for configuring the programmable integrated circuit with the first configuration.

From operation 1504, the method 1500 flows to operation 1506 for receiving, by the FCU, a second configuration from the programmable logic in the plurality of clusters.

At operation 1508, a component of the programmable integrated circuit is reconfigured based on the second configuration.

In one example, the second configuration is received while the programmable integrated circuit is operating after being configured with the first configuration. Further, the component of the programmable integrated circuit is reconfigured while the programmable integrated circuit is operating without affecting operation of the programmable logic in the plurality of clusters not being reconfigured.

In one example, the method 1500 further comprises receiving, by the FCU, a third configuration from a computing device outside the programmable integrated circuit for reconfiguring another component of the programmable integrated circuit while the programmable integrated circuit is operating.

In one example, the component being reconfigured is selected from a group consisting of a portion of the programmable logic in the plurality of clusters, a communications controller, and a memory controller.

In one example, each cluster includes, for each direction of iNOC row traffic, a router and a NAP that connects to user logic in the cluster, wherein each router is configured for supporting one or more local addresses.

In one example, broadcast to routers on one of the iNOC rows is implemented by assigning a same broadcast addresses to be a local address for the routers on the iNOC row. Multicast to two or more routers on one of the iNOC rows is implemented by assigning a same multicast addresses to be a local address for the two or more routers on the iNOC row.

In one example, each router is configured to interleave flits incoming from other routers with flits transmitted from the programmable logic in the plurality of clusters.

Another general aspect is for a programmable integrated circuit comprising a plurality of clusters, an iNOC comprising iNOC rows and iNOC columns, an eNOC connected to the iNOC rows and the iNOC columns, and an FCU. The plurality of clusters is disposed on a plurality of cluster rows and a plurality of cluster columns, each cluster comprising programmable logic. The FCU is for configuring the programmable logic in the plurality of clusters based on a first configuration received by the FCU, the FCU being connected to the eNOC. The FCU communicates with the plurality of clusters via the iNOC and the eNOC, where the FCU is configured for receiving a second configuration from the programmable logic in the plurality of clusters for reconfiguring a component of the programmable integrated circuit.

In one example, the second configuration is received while the programmable integrated circuit is operating after being configured with the first configuration. The component of the programmable integrated circuit is reconfigured while the programmable integrated circuit is operating without affecting operation of the programmable logic in the plurality of clusters not being reconfigured.

In one example, the FCU is configured for receiving a third configuration from a computing device outside the programmable integrated circuit for reconfiguring another component of the programmable integrated circuit while the programmable integrated circuit is operating.

In one example, the third configuration is transmitted to the FCU via a PCIe controller connected to the eNOC.

In one example, the component being reconfigured is selected from a group consisting of a portion of the programmable logic in the plurality of clusters, a communications controller, and a memory controller.

In one example, each cluster includes, for each direction of iNOC row traffic, a router and a NAP that connects to user logic in the cluster, and each router is configured for supporting one or more local addresses.

In one example, broadcast to routers on one of the iNOC rows is implemented by assigning a same broadcast addresses to be a local address for the routers on the iNOC row. Further, multicast to two or more routers on one of the iNOC rows is implemented by assigning a same multicast addresses to be a local address for the two or more routers on the iNOC row.

In one example, each router is configured to interleave flits incoming from other routers with flits transmitted from the programmable logic in the plurality of clusters.

In one example, the interleaving of flits at the router is based on a pseudorandom number and a threshold associated with the pseudorandom number to select between one flit incoming from other routers and one flit transmitted from the programmable logic in the plurality of clusters.

In one example, each router includes a command queue for commands and a response queue for responses, wherein flits in the response queue are transmitted before flits in the command queue.

In yet another general aspect, a machine-readable storage medium (e.g., a non-transitory storage medium) includes instructions that, when executed by a machine, cause the machine to perform operations comprising: receiving, by an FCU in the programmable integrated circuit, a first configuration for configuring the programmable integrated circuit. The programmable integrated circuit further comprises a plurality of clusters disposed on a plurality of cluster rows and a plurality of cluster columns, each cluster comprising programmable logic; an iNOC comprising iNOC rows and iNOC columns; and an eNOC connected to the iNOC rows and the iNOC columns. The FCU is connected to the eNOC, and the FCU communicates with the plurality of clusters via the iNOC and the eNOC. The machine further performs operations comprising configuring the programmable integrated circuit with the first configuration; receiving, by the FCU, a second configuration from the programmable logic in the plurality of clusters; and reconfiguring a component of the programmable integrated circuit based on the second configuration.

Figure 16:
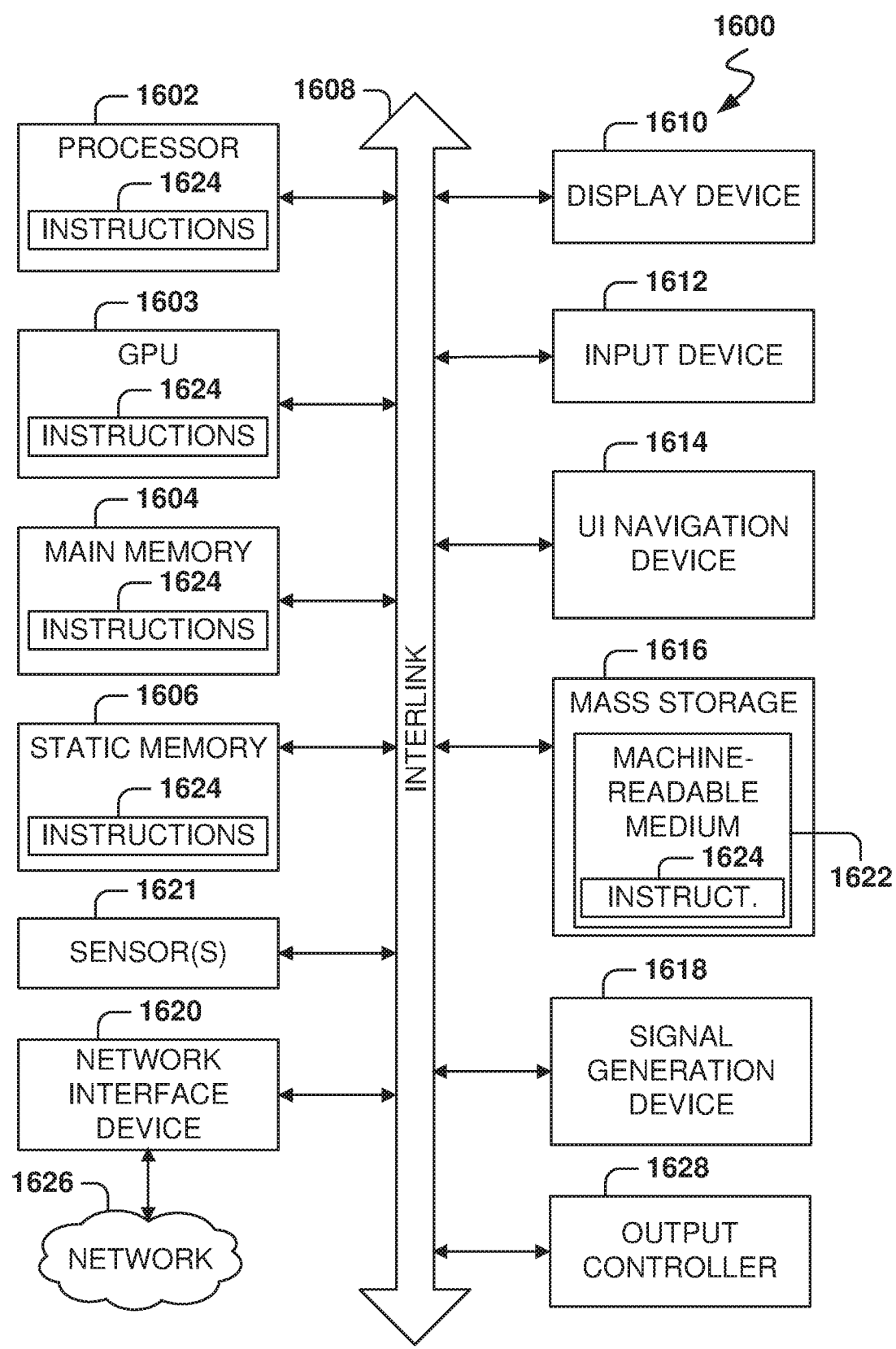
FIG. 16 is a block diagram illustrating an example of a machine upon or by which one or more example process embodiments described herein may be implemented or controlled.

FIG. 16 is a block diagram illustrating an example of a machine 1600 upon or by which one or more example process embodiments described herein may be implemented or controlled. In alternative embodiments, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in a peer-to-peer (P2P) (or other distributed) network environment. Further, while only a single machine 1600 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1600 may include a hardware processor 1602 (e.g., a central processing unit (CPU), a hardware processor core, or any combination thereof), a graphics processing unit (GPU) 1603, a main memory 1604, and a static memory 1606, some or all of which may communicate with each other via an interlink (e.g., bus) 1608. The machine 1600 may further include a display device 1610, an alphanumeric input device 1612 (e.g., a keyboard), and a user interface (UI) navigation device 1614 (e.g., a mouse). In an example, the display device 1610, alphanumeric input device 1612, and UI navigation device 1614 may be a touch screen display. The machine 1600 may additionally include a mass storage device (e.g., drive unit) 1616, a signal generation device 1618 (e.g., a speaker), a network interface device 1620, and one or more sensors 1621, such as a Global Positioning System (GPS) sensor, compass, accelerometer, or another sensor. The machine 1600 may include an output controller 1628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 1616 may include a machine-readable medium 1622 on which is stored one or more sets of data structures or instructions 1624 (e.g., software) embodying or utilized by any one or more of the techniques or functions described herein. The instructions 1624 may also reside, completely or at least partially, within the main memory 1604, within the static memory 1606, within the hardware processor 1602, or within the GPU 1603 during execution thereof by the machine 1600. In an example, one or any combination of the hardware processor 1602, the GPU 1603, the main memory 1604, the static memory 1606, or the mass storage device 1616 may constitute machine-readable media.

While the machine-readable medium 1622 is illustrated as a single medium, the term "machine-readable medium" may include a single medium, or multiple media, (e.g., a centralized or distributed database, and/or associated caches and servers) configured to store the one or more instructions 1624.

The term "machine-readable medium" may include any medium that is capable of storing, encoding, or carrying instructions 1624 for execution by the machine 1600 and that cause the machine 1600 to perform any one or more of the techniques of the present disclosure, or that is capable of storing, encoding, or carrying data structures used by or associated with such instructions 1624. Non-limiting machine-readable medium examples may include solid-state memories, and optical and magnetic media. In an example, a massed machine-readable medium comprises a machine-readable medium 1622 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1624 may further be transmitted or received over a communications network 1626 using a transmission medium via the network interface device 1620.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A programmable integrated circuit comprising:
    a plurality of clusters disposed on a plurality of cluster rows and a plurality of cluster columns, each cluster comprising programmable logic;
    an internal network on chip (iNOC) comprising iNOC rows and iNOC columns; and
    an external network on chip (eNOC) outside the plurality of clusters, each iNOC row configured for transporting data and comprising connections to clusters in a cluster row and the eNOC, each iNOC column configured for transporting data and comprising connections to clusters in a cluster column and the eNOC.

2. The programmable integrated circuit as recited in claim 1, further comprising:
    a plurality of communication modules with external interfaces for exchanging data external entities, the plurality of communication modules connected to the eNOC and configured for communication with the plurality of clusters via the eNOC.

3. The programmable integrated circuit as recited in claim 1, wherein one of the iNOC rows or the iNOC columns comprise master connections to clusters and to the eNOC, and one of the iNOC rows or the iNOC columns comprise slave connections to clusters and to the eNOC.

4. The programmable integrated circuit as recited in claim 1, wherein each cluster includes, for each direction of iNOC row traffic, a router and a network access point (NAP) that connects to user logic in the cluster.

5. The programmable integrated circuit as recited in claim 1, wherein the iNOC is configured for communications of multiple traffic types including packet transfer, data streams, and raw user data.

6. The programmable integrated circuit as recited in claim 1, wherein the iNOC is configured for transferring packets that are divided into one or more flits.

7. The programmable integrated circuit as recited in claim 1, wherein a first user logic in master mode is configured for sending a read request to a slave memory controller in slave mode, the read request being sent through an iNOC row connected to the first user logic to the eNOC and from the eNOC to the slave memory controller.

8. The programmable integrated circuit as recited in claim 1, wherein a combination of iNOC and eNOC communications enable any cluster to communicate to any other cluster and to communication modules with external interfaces coupled to the eNOC.

9. The programmable integrated circuit as recited in claim 1, wherein an Ethernet controller is coupled to at least one iNOC column, wherein flits used for communication in the at least one iNOC column encapsulate Ethernet packets.

10. The programmable integrated circuit as recited in claim 1, further comprising:
a PCIe controller connected to the eNOC, the PCIE controller being configured for sending a request to a second user logic in slave mode, the request being sent through the eNOC to an iNOC column, connected to the second user logic, which forwards the request to the second user logic.

11. The programmable integrated circuit as recited in claim 1, further comprising:
a PCIe controller, connected to the eNOC, configured for communications to a memory controller, connected to the eNOC, via the eNOC without utilizing any programmable logic from the plurality of clusters.

12. A method comprising:
receiving, at a programmable integrated circuit, a configuration for the programmable integrated circuit, the programmable integrated circuit comprising:
a plurality of clusters disposed on a plurality of cluster rows and a plurality of cluster columns, each cluster comprising programmable logic;
an internal network on chip (iNOC) comprising iNOC rows and iNOC columns; and
an external network on chip (eNOC) outside the plurality of clusters, each iNOC row configured for transporting data and comprising connections to clusters in a cluster row and the eNOC, each iNOC column configured for transporting data and comprising connections to clusters in a cluster column and the eNOC;
configuring the programmable integrated circuit based on the configuration; and
providing communications, utilizing a combination of iNOC and eNOC communications, to enable any cluster to communicate to any other cluster and to communication modules with external interfaces coupled to the eNOC.

13. The method as recited in claim 12, wherein the programmable integrated circuit further comprises a plurality of communication modules with external interfaces for exchanging data external entities, the plurality of communication modules connected to the eNOC and configured for communication with the plurality of clusters via the eNOC.

14. The method as recited in claim 12, wherein one of the iNOC rows or the iNOC columns comprise master connections to clusters and to the eNOC, and one of the iNOC rows or iNOC columns comprise slave connections to clusters and to the eNOC.

15. The method as recited in claim 12, wherein each cluster includes, for each direction of iNOC row traffic, a router and a network access point (NAP) that connects to user logic in the cluster.

16. The method as recited in claim 12, wherein the iNOC is configured for communications of multiple traffic types including packet transfer, data streams, and raw user data.

17. The method as recited in claim 12, further comprising:
transferring, by the iNOC, packets by dividing the packets into one or more flits.

18. The method as recited in claim 12, further comprising:
sending, from a first user logic in master mode, a read request to a slave memory controller in slave mode, the read request being sent through an iNOC row connected to the first user logic to the eNOC and from the eNOC to the slave memory controller.

19. The method as recited in claim 12, wherein an Ethernet controller is coupled to at least one iNOC column, wherein flits used for communication in the at least one iNOC column encapsulate Ethernet packets.

20. A non-transitory machine-readable storage medium including instructions that, when executed by a machine, cause the machine to perform operations comprising:
receiving, at a programmable integrated circuit, a configuration for the programmable integrated circuit, the programmable integrated circuit comprising:
a plurality of clusters disposed on a plurality of cluster rows and a plurality of cluster columns, each cluster comprising programmable logic;
an internal network on chip (iNOC) comprising iNOC rows and iNOC columns; and
an external network on chip (eNOC) outside the plurality of clusters, each iNOC row configured for transporting data and comprising connections to clusters in a cluster row and the eNOC, each iNOC column configured for transporting data and comprising connections to clusters in a cluster column and the eNOC;
configuring the programmable integrated circuit based on the configuration; and
providing communications, utilizing a combination of iNOC and eNOC communications, to enable any cluster to communicate to any other cluster and to communication modules with external interfaces coupled to the eNOC.

* * * * *